(12) United States Patent
Fitzgerald

(10) Patent No.: US 7,535,089 B2
(45) Date of Patent: May 19, 2009

(54) MONOLITHICALLY INTEGRATED LIGHT EMITTING DEVICES

(75) Inventor: Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 223 days.

(21) Appl. No.: 11/591,657

(22) Filed: Nov. 1, 2006

(65) Prior Publication Data

US 2007/0105256 A1    May 10, 2007

Related U.S. Application Data

(60) Provisional application No. 60/790,204, filed on Apr. 7, 2006, provisional application No. 60/732,442, filed on Nov. 1, 2005.

(51) Int. Cl.
*H01L 23/06* (2006.01)

(52) U.S. Cl. .................. 257/684; 257/80; 257/82; 257/103; 257/444; 257/E21.092

(58) Field of Classification Search ............ 257/80, 257/82, 103, 444, 684
See application file for complete search history.

(56) References Cited

U.S. PATENT DOCUMENTS

| | | | |
|---|---|---|---|
| 5,221,413 | A | 6/1993 | Brasen et al. |
| 5,374,564 | A | 12/1994 | Bruel |
| 5,442,205 | A | 8/1995 | Brasen et al. |
| 5,714,395 | A | 2/1998 | Bruel |

(Continued)

FOREIGN PATENT DOCUMENTS

EP    0683522 A2    11/1995

(Continued)

OTHER PUBLICATIONS

Agarwal et al., "Efficient production of silicon-on-insulator films by co-implantation of He+ with H+ ", *App. Phys. Lett.* 72, 1086-1088 (1998).

(Continued)

*Primary Examiner*—Wai-Sing Louie
(74) *Attorney, Agent, or Firm*—Wolf, Greenfield & Sacks, P.C.

(57) ABSTRACT

Methods and structures for monolithically integrating monocrystalline silicon and monocrystalline non-silicon materials and devices are provided. In one structure, a monolithically integrated semiconductor device structure comprises a silicon substrate and a first monocrystalline semiconductor layer disposed over the silicon substrate, wherein the first monocrystalline semiconductor layer has a lattice constant different from a lattice constant of relaxed silicon. The structure further includes an insulating layer disposed over the first monocrystalline semiconductor layer in a first region and a monocrystalline silicon layer disposed over the insulating layer in the first region. The structure includes at least one silicon-based electronic device including an element including at least a portion of the monocrystalline silicon layer. The structure also includes a second monocrystalline semiconductor layer disposed over at least a portion of the first monocrystalline semiconductor layer in a second region and absent from the first region, wherein the second monocrystalline semiconductor layer has a lattice constant different from the lattice constant of relaxed silicon. The structure includes at least one III-V light-emitting device including an active region including at least a portion of the second monocrystalline semiconductor layer.

45 Claims, 23 Drawing Sheets

U.S. PATENT DOCUMENTS

| | | | |
|---|---|---|---|
| 5,810,924 | A | 9/1998 | Legoues et al. |
| 5,882,987 | A | 3/1999 | Srikrishnan |
| 5,895,936 | A * | 4/1999 | Lee .............................. 257/59 |
| 6,039,803 | A | 3/2000 | Fitzgerald et al. |
| 6,107,653 | A | 8/2000 | Fitzgerald et al. |
| 6,184,111 | B1 | 2/2001 | Henley et al. |
| 6,291,321 | B1 | 9/2001 | Fitzgerald |
| 6,335,264 | B1 | 1/2002 | Henley et al. |
| 6,391,740 | B1 | 5/2002 | Cheung et al. |
| 6,458,723 | B1 | 10/2002 | Henley et al. |
| 6,500,732 | B1 | 12/2002 | Henley et al. |
| 6,503,773 | B2 | 1/2003 | Fitzgerald |
| 6,518,644 | B2 | 2/2003 | Fitzgerald |
| 6,548,382 | B1 | 4/2003 | Henley et al. |
| 6,632,724 | B2 | 10/2003 | Henley et al. |
| 6,645,829 | B2 | 11/2003 | Fitzergald |
| 6,677,192 | B1 | 1/2004 | Fitzgerald |
| 6,723,622 | B2 | 4/2004 | Murthy et al. |
| 6,852,556 | B2 | 2/2005 | Yap |
| 7,180,098 | B2 * | 2/2007 | Speyer et al. .................. 257/82 |
| 2002/0105015 | A1 | 8/2002 | Kubo et al. |
| 2003/0021549 | A1 | 1/2003 | Chason et al. |
| 2003/0218189 | A1 | 11/2003 | Christiansen et al. |
| 2004/0026765 | A1 | 2/2004 | Currie et al. |
| 2004/0074866 | A1 | 4/2004 | Fournel et al. |
| 2004/0087117 | A1 | 5/2004 | Leitz et al. |
| 2004/0121507 | A1 | 6/2004 | Bude et al. |
| 2004/0178406 | A1 | 9/2004 | Chu |
| 2005/0001247 | A1* | 1/2005 | Ozawa et al. ................ 257/291 |
| 2005/0023552 | A1 | 2/2005 | Chang et al. |
| 2005/0205954 | A1 | 9/2005 | King et al. |
| 2006/0001088 | A1 | 1/2006 | Chan et al. |
| 2006/0049409 | A1 | 3/2006 | Rafferty et al. |
| 2006/0055800 | A1 | 3/2006 | Ackland et al. |

FOREIGN PATENT DOCUMENTS

| | | | |
|---|---|---|---|
| WO | WO 98/59365 | A1 | 12/1998 |
| WO | WO 99/53539 | A1 | 10/1999 |
| WO | WO 0100522 | A2 | 1/2001 |
| WO | WO 01/99169 | A2 | 12/2001 |
| WO | WO 03/103031 | A2 | 12/2003 |
| WO | WO 2004/006327 | A2 | 1/2004 |
| WO | WO 2004/021420 | A2 | 3/2004 |

OTHER PUBLICATIONS

Armstrong et al., "Design of Si/SiGe heterojunction complementary metal-oxide-semiconductor transistors", *IEEE, Electronic Devices Meeting*, pp. 31.1.1-31.1.4, 1995.

Bruel, "Silicon on insulator material technology", *Electron Lett.* 31, 1201-1202 (1995).

Cheng et al., "Electron mobility enhancement in strained-Si n-MOSFETs fabricated on SiGe-on-insulator (SGOI) substrates," *IEEE Electronic Device Letters*, Jul. 2001, pp. 321-323, vol. 22, No. 7.

Cheng et al., "Relaxed silicon-germanium on insulator (SGOI)," *Symposium*, Nov. 26-28, 2001, pp. 21-26, vol. 686, *Mater. Res. Soc.*, Warrendale, PA, US.

Cheng et al., "Relaxed silicon-germanium on insulator substrate by layer transfer," Feature Article, Dec. 2001, pp. L37-39, vol. 30, No. 12, *Journal of Electronic Materials*.

Cheng et al., "SiGe-on-Insulator (SGOI): substrate preparation and MOSFET fabrication for electron mobility evaluation," *IEEE International SOI Conference*, Oct. 1-4, 2001, pp. 13-14, Cat. No. 01CH37207, IEEE, Piscataway, NJ, US.

Corni et al., "Helium-implanted silicon: A study of bubble precursors", *J. Appl. Phys.* 85, 1404-1408 (1999).

Corni et al., "Solid State Phenomena" 69-70, 229-234 (1999).

Currie et al., "Controlling threading dislocation densities in Ge on Si using graded SiGe layers and chemical-mechanical polishing," *Applied Physics Letters*, vol. 72, No. 14, 1998, p. 1718-1720.

Currie et al., "Carrier mobilities and process stability of strained Si n- and p-MOSFETs on SiGe virtual substrates," *Journal of Vacuum Science & Technology*, Nov. 2001, pp. 2268-2279, vol. 19, No. 6, American Vacuum Society.

Fitzgerald et al., "Dislocations in relaxed SiGe/Si heterostructures," International Conference on Extended Defects in Semiconductors (EDS' 98), Sep. 6-11, 1998, pp. 227-238, vol. 171, No. 1, *Journal: Physica Status Solidi* A, Wiley-VCH, Germany.

Fitzgerald et al., "Dislocation dynamics in relaxed graded composition semiconductors, Materials Science and Engineering B67," *Elsevier Science S.A.*, 1999, p. 53-61.

Fitzgerald et al., "Totally relaxed GexSi1-x layers with low threading dislocation densities grown on Si substrates," *Applied Physics Letters*: American Institute of Physics, vol. 59, No. 7, 1991, p. 811-813.

Friedman et al., "A Proposed Electroabsorption Modulator at 1.55 μm in Silicon/Silicon-Germanium Asymmetric Quantum-Well Structures," *IEEE Photonics Technology Letters*, vol. 5, No. 10, 1993, p. 1200-1202.

Gracias et al., "Experiments on Silicon-To-Silicon Direct Bonding," XIII Meeting of the Brazilian Vacuum Society, Campinas, Brazil, Jul. 1998, pp. 19-22;.

Gupta et al., "Improved hole mobilities and thermal stability in a strained-Si/strained-$Si_{1-y}$/strained-Si heterostructure grown on a relaxed $Si_{1-x}Ge_x$ Buffer," *Applied Physics Letters*, AIP, vol. 86, No. 19, pp. 192104-1-192104-3, 2005.

Johnson, "Mechanism for hydrogen compensation of shallow-acceptor impurities in single-crystal silicon," *Phys. Rev.* B 31, 5525-5528 (1985).

Kanel et al., "Very high hole mobilities in modulation-doped Ge quantum wells grown by low-energy plasma enchanced chemical vapor despositoin," *Applied Physics Letters*, AIP, vol. 80, No. 16, pp. 2922-2924, 2002.

Langdo et al., "SiGe-Free Strained Si on Insulator by Wafer Bonding and Layer Transfer," *Applied Physics Letters*, Jun. 16, 2003, pp. 4256-4257, vol. 82, No. 24, American Institute of Physics, Melville, NY, US.

Lauer et al., "Fully Depleted n-MOSFETs on Supercritical Thickness Strained SOI," *IEEE Electron Device Letters*, vol. 25, No. 2, pp. 83-85, 2004.

Lee et al., "Strained Ge channel p-type metal-oxide-semiconductor field-effect transistors grown on $Si_{1-x}Ge_x$/Si virtual substrates," *Applied Physics Letters*, Nov. 12, 2001, pp. 3344-3346, vol. 79, No. 20, American Institute of Physics.

Lee et al., "Strained Ge channel p-type MOSFETs fabricated on $Si_{1-x}Ge_x$//Si virtual substrates," Symposium, Nov. 26-28, 2001, pp. 39-43, vol. 686, *Mater. Res. Soc.*, Warrendale, PA, US.

Leitz et al., "Dislocation glide and blocking kinetics in compositionally graded SiGe/Si," *Journal of Applied Physics*: American Institute of Physics, vol. 90, No. 6, 2001, p. 2730-2736.

Liu et al., "Micromechanism Fabrication using Silicon Fusion Bonding," *Robotics and Computer Integrated manufacturin* 17, 2001, pp. 131-137.

Liu et al., "High-quality Ge films on Si substrates using Sb sufractant-mediated graded SiGe buffers," *Applied Physics Letters*: American Institute of Physics, vol. 79, No. 21, 2001, p. 3431-3433.

Liu et al., Nature 427, 2004, p. 615-618.

Myers et al., "Interaction of coppoer with cavities in silicon," *J. Appl. Phys.* 79, 1337-1350 (1996).

Pitera et al., "Coplanar Integration of Lattice-Mismatched Semiconductors with Silicon by Wafer Bonding Ge/Si1-xGex/Si Virtual Substrates," Feature Article ISSN 0013-4651, 2004, pp. G443-447, vol. 151, No. 7, *Journal of The Electrochemical Society, Inc.*

Raineri et al., "Gettering of metals by voids in silicon," *J. Appl. Phys.* 78, 3727-3735 (1995).

Sadek et al., "Si/SiGe CMOS Possibilities," *Solid-State Elctronics*, vol. 38, No. 9, pp. 1731-1734, 1995.

Sadek et al., "Design of Si/SiGe heterojunction complementary metal-oxide-semiconductor transistors," *IEEE Transactions of Electron Devices*, vol. 43, No. 8, pp. 1224-1231.

Sieg et al., "High minority-carrier lifetimes in GaAs grown on low-defect-density Ge/GeSi/Si substrates," *Applied Physics Letters*, Nov. 23, 1998, pp. 3111-3113, vol. 73, No. 21, American Institute of Physics.

Taraschi et al., "Relaxed SiGe on insulator fabricated via wafer bonding and layer transfer: Etch-back and smart-cut alternatives," Proceedings of the Tenth International Symposium (Electrochemical Society Proceedings), Mar. 25-29, 2001, pp. 27-32, vol. 2001-3, *Electrochemical Soc.*, Pennington, NJ, US.

Taraschi et al., "Strained Si, SiGe, and Ge on-insulator: review of wafer bonding fabrication techniques," Feature Article ISSN 0038-1101, 2004, pp. 1297-1305, vol. 48, *Solid-State Electronics*.

Taraschi et al., "Strained-Si-on-Insulator (SSOI) and SiGe-on-Insulator (SGOI): Fabrication obstacles and Solutions," Symposium, Dec. 2-4, 2002, pp. 105-110, vol. 745, Material Identity No. XX-2003-01738, *Mater. Res. Soc. Symposium Proceedings*.

Taraschi et al., "Ultrathin Strained Si-on-Insulator and SiGe-on-Insulator Created using Low Temperature Wafer Bonding and Metastable Stop Layers," Feature Article *ISSN* 0013-4651, 2004, pp. G47-G56, vol. 151, No. 1, *Journal of The Electrochemical Society, Inc*.

Taraschi, "Strained Si-on-insulator development accelerates," Journal: Compound Semiconductor, *ISSN* 1096-598X, Apr. 2003, pp. 25-27, vol. 9, No. 9, Franklin Publishing, US.

Taraschi, et al., "Relaxed SiGe-on-insulator fabricated via wafer bonding and etch back," *Journal of Vacuum Science and Technology*, Mar. 2002, pp. 725-726, vol. 20, No. 2, American Institute of Physics, New York, NY, US.

Tong et al., "A "smarter-cut" approach to low temperature silicon layer transfer," *Appl. Phys. Lett*. 72, 49-51 (1998).

Ulyashin et al., "The hydrogen gettering at post-implantation hydrogen plasma treatments of helium- and hydrogen implanted Czochralski silicon," *Materials Science and Engineering* B73-B73, 64-68 (2000).

Usenko et al., "Transformation of hydrogen trapped onto microbubbles into H platelet layer in SI," *Journal of Materials Science*: Materials in Electronics 14, 305-309 (2003).

Yonenaga, "Growth and mechanical properties of GeSi bulk crystals," *Journal of Materials Science*: Materials in Electronics, vol. 10, 1999, p. 329-333.

Zelikson et al., "Treshold and saturation effects for photosignals in an amorphous silicon waveguide structure," *Applied Phys. Letters*: American Institute of Physics., vol. 59, No. 21, 1991, p. 2660-2662.

Erratum of B9, *Journal of Materials Science Materials* in Electronics ISSN 0957-4522, Oct. 2002, p. 621, vol. 13, No. 10.

Nature, Silicon-based quantum wells, vol. 364, 1993, p. 19.

International Search Report PCT/US2005/021281 mailed Mar. 29, 2006.

International Search Report PCT/US2005/021283, dated Oct. 28, 2005.

Notification of Transmittal of the International Search Report and the Written Opinion of the ISR for International Application No. PCT/US2005/035595, date mailed Feb. 15, 2006.

Written Opinion and International Search Report for PCT/US2005/042865, dated Jul. 13, 2006.

* cited by examiner

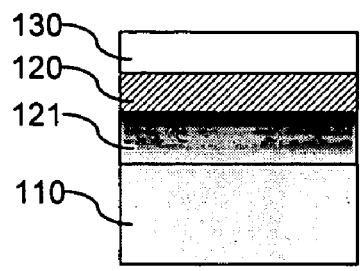 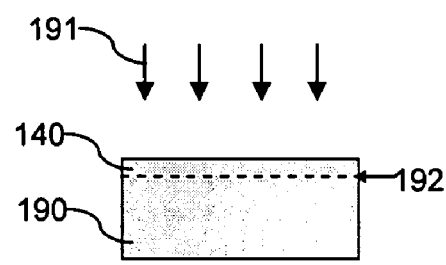
FIG. 3A          FIG. 3B
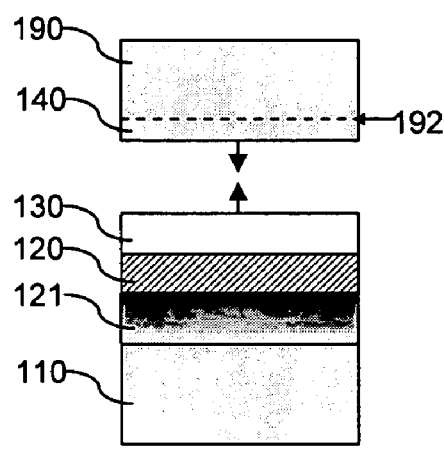 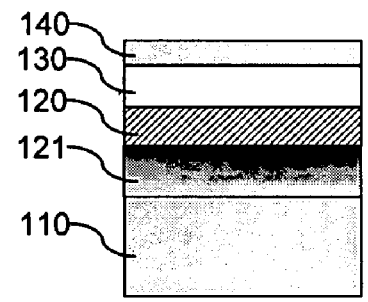
FIG. 3C          FIG. 3D

MONOLITHICALLY INTEGRATED LIGHT EMITTING DEVICES

RELATED APPLICATIONS

This application claims priority under 35 U.S.C. § 119(e) to U.S. Provisional Application Ser. No. 60/732,442, entitled "INTEGRATED LIGHT ARRAYS," filed on Nov. 1, 2005 and U.S. Application Ser. No. 60/790,204, entitled "INTEGRATED LIGHT ARRAYS," filed on Apr. 7, 2006, which are herein incorporated by reference in their entirety.

FIELD OF INVENTION

This invention relates generally to the manufacture of semiconductor structures. More particularly the invention relates to the monolithic integration of silicon and other monocrystalline semiconductor materials and/or devices.

BACKGROUND

The concept of combining III-V materials with silicon was born in the 1980s. Although the degree of progress in silicon technology could not be anticipated at the time and therefore many potential applications could not be detailed, such technology was pursued on a fundamental basis. The basic idea was that combining the ability to emit and detect light (III-V material) with digital logic (silicon digital circuits) would result in new markets as well as disrupt old markets. However, actually accomplishing this goal in a practical way has proven more a challenge than was at first recognized.

SUMMARY OF INVENTION

Herein, methods and structures for monolithically integrating monocrystalline silicon and monocrystalline non-silicon materials and devices are provided.

In one aspect, a monolithically integrated semiconductor device structure comprising a silicon substrate, a first monocrystalline semiconductor layer disposed over the silicon substrate, wherein the first monocrystalline semiconductor layer has a lattice constant different from a lattice constant of relaxed silicon, an insulating layer disposed over the first monocrystalline semiconductor layer in a first region, a monocrystalline silicon layer disposed over the insulating layer in the first region, at least one silicon-based electronic device comprising an element including at least a portion of the monocrystalline silicon layer, a second monocrystalline semiconductor layer disposed over at least a portion of the first monocrystalline semiconductor layer in a second region and absent from the first region, wherein the second monocrystalline semiconductor layer has a lattice constant different from the lattice constant of relaxed silicon, and at least one III-V light-emitting device comprising an active region including at least a portion of the second monocrystalline semiconductor layer.

In another aspect, a method of forming a semiconductor structure is provided. The method comprises providing a silicon substrate, disposing a first monocrystalline semiconductor layer over the silicon substrate, wherein the first monocrystalline semiconductor layer has a lattice constant different from a lattice constant of relaxed silicon, disposing an insulating layer over the first monocrystalline semiconductor layer in a first region, disposing a monocrystalline silicon layer over the insulating layer in the first region, and disposing a second monocrystalline semiconductor layer over at least a portion of the first monocrystalline semiconductor layer in a second region, wherein the second monocrystalline semiconductor layer is absent from the first region, and wherein the second monocrystalline semiconductor layer has a lattice constant different from the lattice constant of relaxed silicon.

In another aspect, a semiconductor structure comprises a silicon substrate, a first monocrystalline semiconductor layer disposed over the silicon substrate, wherein the first monocrystalline semiconductor layer has a lattice constant different from a lattice constant of relaxed silicon, a monocrystalline silicon layer disposed over the first monocrystalline semiconductor layer in the first region, and a second monocrystalline semiconductor layer disposed on at least a portion of the first monocrystalline semiconductor layer in a second region and absent from the first region, wherein the second monocrystalline semiconductor layer has a lattice constant different from the lattice constant of relaxed silicon.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 3A-3D are cross-section schematics illustrating a process for making a multilayer wafer, in accordance with one embodiment;

DETAILED DESCRIPTION

Figure 1:
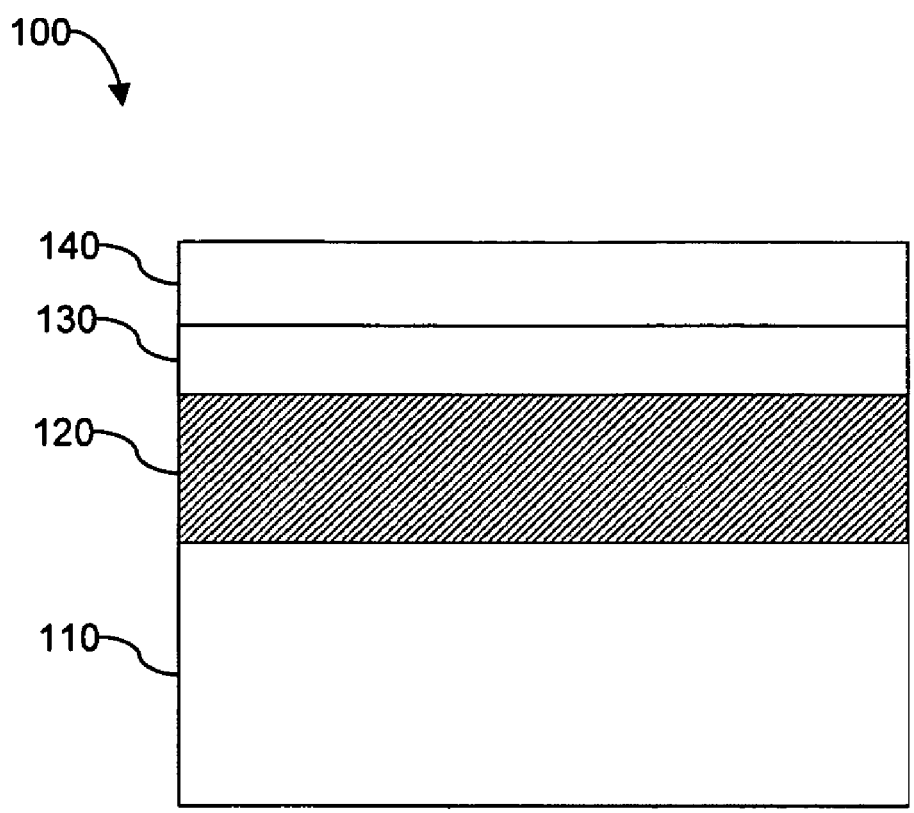
FIG. 1 is a cross-section schematic of a multilayer wafer comprising monocrystalline silicon and monocrystalline non-silicon semiconductor layers, in accordance with one embodiment.

Embodiments presented herein provide examples of implementations of methods and structures to facilitate the monolithic integration of a silicon-based monocrystalline layer with one or more monocrystalline semiconductor layers having a lattice constant(s) other than that of relaxed silicon. In some embodiments, silicon-based devices are monolithically integrated with devices having active regions formed of one or more monocrystalline semiconductors having lattice constant(s) other than that of relaxed silicon. Silicon-based devices can include (but are not limited to) silicon-based electronics, such as n-type metal oxide semiconductor (NMOS) and p-type metal oxide semiconductor (PMOS) field effect transistors (FETs), complementary metal oxide semiconductor (CMOS) devices, and bipolar transistors. Silicon-based devices can also include optoelectronic devices, such as silicon-based photodetectors. Non-silicon semiconductor devices can include (but are not limited to) III-V light emitting devices (e.g., light emitting diodes (LEDs) and laser diodes), III-V photodetectors, and III-V electronic devices, such as III-V high electron mobility transistors (HEMTs), heterojunction bipolar transistors (HBTs), and metal semiconductor FETs (MESFETs).

In some embodiments, monolithic integration of a silicon-based monocrystalline layer with monocrystalline semiconductor layer(s) having lattice constant(s) other than that of relaxed silicon can facilitate the integration of light emitting devices with silicon-based devices, such as CMOS circuits. The light emitting devices can emit visible, infrared, and/or ultraviolet light, as the techniques presented herein are not limited in this respect. As a result of the ability to monolithically integrate these devices, light emitting devices can be monolithically integrated with silicon CMOS circuits that control and/or drive the light emitting devices. The silicon CMOS circuits can also perform computational functions. The light emitting devices can take the form of an array of light emitting devices, such as one-dimensional arrays or two-dimensional arrays. Thus, the light emitting devices can be arranged to emit light over a line and/or an area (e.g., a rectangular area), and may be controlled and selectively driven to emit light by the monolithically integrated silicon CMOS circuits. Photodetectors can also be monolithically integrated with the silicon CMOS, with or without light emitting devices. The photodetectors may be silicon-based photodetectors, if desired, and may be integrated proximate the light emitting devices so as to detect the light emitted by the light emitting devices. Output from the photodetectors can be provided to the silicon CMOS circuits, which can vary the driving of the light emitting devices based at least partially on the outputs of the photodetectors. Such functionality can be used to regulate drive power provided to a light emitting device and/or to activate redundant light emitting devices when a given light emitting device is detected to be functioning incorrectly, for example, when the light emitting device's output has failed or degraded.

Monolithic integration of light emitting devices and silicon-based electronics, such as CMOS, can be utilized to form micro-displays, high resolution printer bars and/or areas, imaging bars and/or areas, computers-on-chip having integrated micro-displays, and optical interconnects for silicon-based electronics.

In some embodiments, monolithic integration of a silicon-based monocrystalline layer with monocrystalline semiconductor layer(s) having lattice constants other than that of relaxed silicon can facilitate the integration of silicon photodetectors with non-silicon photodetectors, such as germanium and/or III-V photodetectors. The integration of silicon and non-silicon photodetectors can enable high-resolution imaging chips having silicon and non-silicon photodetector arrays, further integrated with silicon-based electronics, such as CMOS.

In some embodiments, monolithic integration of a silicon-based monocrystalline layer with monocrystalline semiconductor layers having lattice constants other than that of relaxed silicon can also facilitate the integration of silicon-based electronic devices, such as silicon MOSFETs and bipolar transistors, and non-silicon semiconductor electronic devices, such as III-V HEMTs, HBTs and/or MESFETs. Such integration can enable the integration of digital circuits formed with silicon CMOS and analog/RF circuits formed of III-V materials.

Some embodiments presented achieve the monolithic integration of silicon and non-silicon materials and devices using a multilayer starting wafer that includes a silicon-based monocrystalline layer with one or more monocrystalline semiconductor layers having lattice constants other than that of relaxed silicon. Furthermore, some techniques presented herein allow for the epitaxial deposition of non-silicon materials on the monocrystalline non-silicon semiconductor layer. The epitaxially grown non-silicon materials can include device heterostructures for non-silicon semiconductor devices, such as III-V light emitting devices (e.g., LEDs and laser diodes), III-V photodetectors, and III-V electronic devices, such as III-V HEMTs, HBTs, and MESFETs. The multilayer starting wafer allows for the surface of the epitaxially grown non-silicon device materials to be substantially coplanar with the silicon-based monocrystalline layer, thereby facilitating co-processing (e.g., photolithography, interconnect formation, and other back-end processing) of the silicon and non-silicon device structures.

FIG. 1 illustrates an embodiment of a multilayer wafer comprising monocrystalline silicon and monocrystalline non-silicon semiconductor layers. Multilayer wafer 100 includes a silicon substrate 110, a monocrystalline semiconductor layer 120 disposed over the silicon substrate 110, an insulating layer 130 disposed over the monocrystalline semiconductor layer 120, and a monocrystalline silicon layer 140 disposed over the insulator layer 130.

Monocrystalline semiconductor layer 120 may comprise one or more semiconductor layers. At least one of the layers in monocrystalline semiconductor layer 120 can have a lattice constant different from the lattice constant of relaxed silicon. Monocrystalline semiconductor layer 120 may include one or more germanium layers, one or more silicon-germanium layers, and/or one or more III-V semiconductor layers. Monocrystalline semiconductor layer 120 may include a silicon-germanium graded layer. The silicon-germanium graded layer may have a bottom interface with a first germanium content (e.g., 0% germanium) and may be graded so as to have an increasing germanium content up to a top interface having a second germanium content (e.g., 100% germanium). A germanium layer may be disposed over such a silicon-germanium graded layer, as part of layer 120.

In some embodiments, monocrystalline semiconductor layer 120 may include one or more III-V semiconductor layers. Examples of III-V semiconductor layers include gallium arsenide, gallium nitride, indium phosphide, indium gallium arsenide, indium gallium nitride, aluminum gallium arsenide, aluminum gallium nitride, and/or other III-V semiconductor layers known to those of skill in the art. In some embodiments, the III-V semiconductor layer may be disposed over a germanium layer. Furthermore, the germanium layer may be disposed over a silicon-germanium graded layer, as previously described. In some embodiments, the III-V semiconductor layer may be disposed over a silicon-germanium layer and/or a silicon-germanium graded layer.

In some embodiments, monocrystalline semiconductor layer 120 may include two or more monocrystalline semiconductor layers disposed one over the other and having lattice constants different from each other and different from the lattice constant of relaxed silicon. The two or more monocrystalline semiconductor layers can comprise, for example, a germanium layer and an indium phosphide layer, a germanium layer and a gallium nitride layer, a gallium arsenide layer and an indium phosphide layer, and/or a gallium arsenide layer and a gallium nitride layer. One of the monocrystalline semiconductor layers may be suited as an active layer in light-emission devices and the other monocrystalline semiconductor layer may be suited as a channel layer in analog and/or RF devices.

Insulating layer 130 may include any insulating material layer, such as silicon oxide, silicon nitride, silicon oxynitride, any other insulating materials known to those of skill in the art, and/or any combinations thereof. In some embodiments, layer 130 is a non-insulating layer, such as a semiconductor and/or a metal layer. In other embodiments, layer 130 may be absent. In such embodiments, the monocrystalline silicon layer 140 may be disposed on (e.g., in contact with) the monocrystalline semiconductor layer 120.

Monocrystalline silicon layer 140 may include a relaxed silicon layer and/or a strained silicon layer. The strained silicon layer may have any desired strain, for example, the strained silicon layer may have a tensile strain of about 1% to 2%. Alternatively, or additionally, a silicon-germanium layer may be disposed over the insulating layer 130.

The multilayer wafer 100 may have any desired diameter, as the techniques presented herein are not limited in this respect. In some embodiments the multilayer wafer has a diameter of at least 150 mm, at least 200 mm, or any other suitable diameter available for a silicon substrate.

Figure 2A:
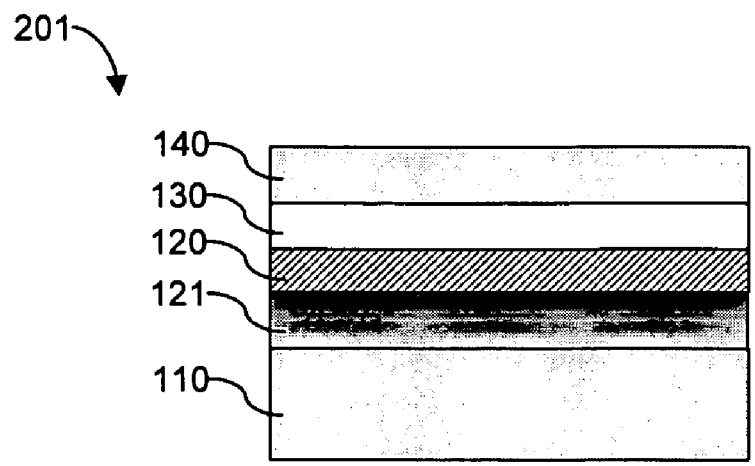
FIGS. 2A-2C are cross-section schematics of multilayer wafers, in accordance with various embodiments.
Figure 2B:
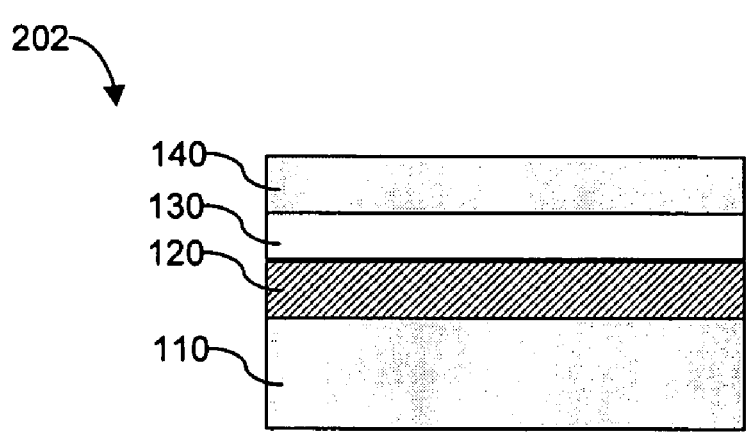
Figure 2C:
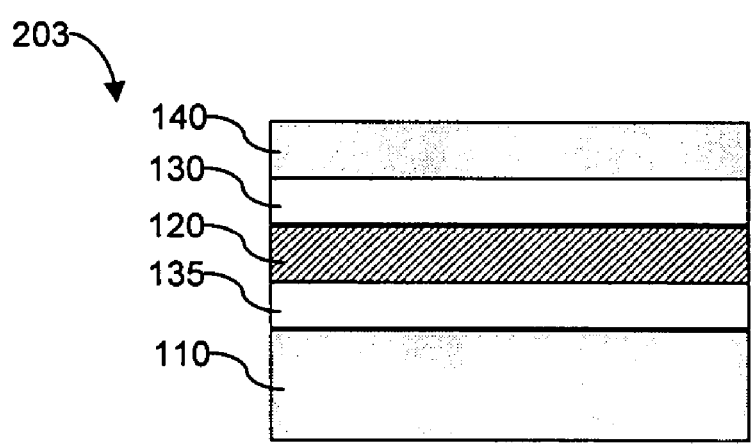

FIGS. 2A-2C schematically illustrate examples of multilayer wafers in accordance with some embodiments. FIGS. 2A-2C illustrates a multilayer wafer 201 having a monocrystalline silicon layer 140 disposed over an insulating layer 130. The insulating layer 130 is disposed over one or more germanium, silicon-germanium, and/or III-V layers 120 disposed over a silicon-germanium graded layer 121. The silicon-germanium graded layer 121 is disposed over a silicon substrate 110.

FIG. 2B illustrates a multilayer wafer 202 comprising a monocrystalline silicon layer 140 disposed over an insulating layer 130. The insulating layer 130 is disposed over one or more germanium, silicon-germanium, and/or III-V layers 120 which are disposed over a silicon substrate 110.

FIG. 2C illustrates a multilayer wafer 203 comprising a monocrystalline silicon layer 140 disposed over an insulating layer 130. The insulating layer 130 is disposed over one or more germanium, silicon-germanium, and/or III-V layers 120. Layer(s) 120 are disposed over an insulating layer 135 which is disposed over a silicon substrate 110. In some embodiments insulating layers 130 and/or 135 may be replaced with a non-insulating layer, such as a semiconductor and/or a metal.

In some embodiments, the monocrystalline semiconductor layer 120 of the multilayer wafers presented herein can overlay substantially all of the silicon substrate 110. The monocrystalline semiconductor layer 120 may be disposed over all or substantially all of the silicon substrate 110. The insulator 130 and/or the monocrystalline silicon layer 140 may also be disposed over substantially all of the silicon substrate 110. Such multilayer wafers may be fabricated using wafer bonding techniques as described below.

FIGS. 3A-3D illustrate an example of a method of making a multilayer wafer, such as multilayer wafer 201 illustrated in FIG. 2A. As shown in FIG. 3A, the method may include providing a handle wafer which can include a silicon substrate 110. A lattice-mismatched silicon-germanium graded layer 121 may be epitaxially grown on the silicon substrate 110, using techniques known to those skilled in the art. For example, the silicon-germanium graded layer 121 may be grown using chemical vapor deposition (CVD). The silicon-germanium graded layer 121 may have a graded germanium content increasing from a lower germanium content to a higher germanium content at the surface of the silicon-germanium graded layer 121. The lower germanium content at a lower interface of the silicon-germanium graded layer 121 may be 0% germanium (e.g., pure silicon) and may be increased in a stepwise manner, continuous manner, or other manner to a desired final germanium content at a top surface of the silicon-germanium graded layer 121. In some embodiments the germanium content at the top surface of the silicon-germanium graded layer is 100% germanium, or any other desired germanium content (e.g., greater than 90% germanium, greater than 75% germanium, greater than 50% germanium). The silicon-germanium graded layer may be chemically mechanically polished (CMP) so as to eliminate any crosshatch roughness introduced during the deposition of the lattice mismatched silicon-germanium on the silicon substrate. Silicon-germanium layer 121 may also be CMPed intermittently via the interruption of the growth process so as to reduce any cross-hatch roughness that may form during epitaxial growth and, in turn, reduce the final threading dislocation density.

A germanium and/or silicon-germanium layer 120 may be disposed over the silicon-germanium graded layer 121. In some embodiments the germanium layer may be chemically mechanically polished after the growth process. In some embodiments, one or more layers may be disposed over the germanium layer and/or silicon-germanium layer 120, including one or more III-V layers. Alternatively, one or more III-V layers may be disposed directly on the silicon-germanium graded layer 121. The one or more III-V layers may include any number of III-V materials (e.g., gallium arsenide, indium phosphide, gallium nitride, any ternary III-V, and/or any combinations thereof). Furthermore, the one or more III-V layers may include graded III-V layers, such as indium gallium arsenide graded layers, or any other graded layer structure including III-V semiconductors.

An insulating layer 130 may be disposed over the germanium and/or silicon-germanium layer 120. The insulating layer 130 may include any type of insulator, such as an oxide (e.g., silicon dioxide), silicon nitride, silicon oxynitride, or any other suitable insulator material. Alternatively, or additionally, a non-insulating layer may be deposited over the germanium and/or silicon-germanium layer 120. The insulating layer 130 may further be polished, for example using chemical mechanical polishing.

FIG. 3B illustrates a donor wafer which may be wafer bonded to the handle wafer shown in FIG. 3A. The donor wafer may be a silicon substrate 190. The silicon substrate 190 may be prepared for wafer bonding and layer transfer using an ion cut procedure. Alternatively, or additionally, a bond and etch back layer transfer process may be used, as is known by those of skill in the art. In the ion cut process, ions (e.g., hydrogen ions, helium ions) are implanted (as indicated by arrows 191) into the surface of silicon substrate 190 so as to form an implantation ion peak 192 at a desired depth from the surface of the silicon substrate. The silicon material above the ion peak 192 (referred to herein as silicon layer 140) can serve as the transfer layer for the wafer bonding process.

FIG. 3C illustrates the wafer bonding process, wherein the donor wafer of FIG. 3B is bonded to the handle wafer of FIG. 3A. As illustrated, the silicon layer 140 of the handle wafer is bonded to the insulating layer 130 of the donor wafer. Alternatively, an insulating layer (e.g., oxide layer) may be disposed over the silicon layer 140 of the donor wafer illustrated in FIG. 3B prior to wafer bonding. In such an embodiment, the wafer bonding process can comprise the bonding of an oxide layer to an oxide layer. After wafer bonding, the bonded pair of wafers may be annealed at a desired temperature so as to initiate crack formation and delamination of layer 140. Annealing may also strengthen bonding of the transfer layer to the handle wafer. The resulting multilayer semiconductor wafer structure is shown in FIG. 3D where silicon layer 140 is disposed over the handle wafer shown in FIG. 3A. Since the surface of the delaminated layer 140 may be rough, the wafer surface can then be polished, for example, by chemical mechanical polishing.

FIG. 4 illustrates a method of making multilayer wafer 202 shown in FIG. 2 using a non-silicon donor substrate. The non-silicon donor substrate may include a germanium substrate or III-V substrate, such as gallium arsenide, gallium nitride, indium phosphide, or gallium phosphide. FIG. 4A illustrates a donor substrate 180 formed of a non-silicon material. The donor substrate 180 is implanted (indicated by arrows 181) with ions used in an ion-cut process. The ions are implanted with implantation energies so as to form a peak concentration at a desired depth 182 from the surface of the non-silicon donor substrate 180. The material layer 120 lies above the implant peak 182.

Figure 4A:
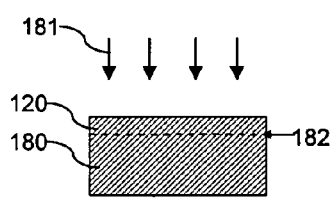
FIGS. 4A-4H are cross-section schematics illustrating another process for making a multilayer wafer, in accordance with one embodiment.
Figure 4B:
Figure 4C:
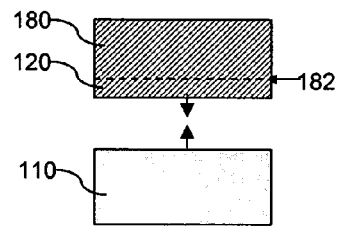
Figure 4D:
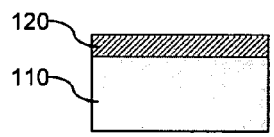
Figure 4E:
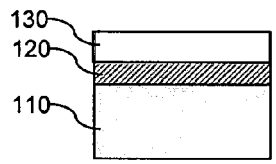
Figure 4F:
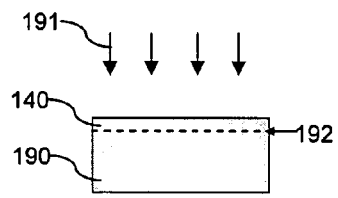

FIG. 4B illustrates a silicon handle substrate 110 to which the donor substrate 180 may be wafer bonded, as shown in FIG. 4C. After wafer bonding, the wafer bonded pair may be annealed so as to initiate crack formation at the implant peak 182 of the donor substrate and thereby result in the layer transfer of non-silicon layer 120 onto the silicon handle substrate 110, as shown in FIG. 4D. Annealing may also strengthen the bond between layer 120 and the silicon handle substrate 110. An insulating layer 130 may then be deposited on the non-silicon layer 120, as shown in FIG. 4E.

Figure 4G:
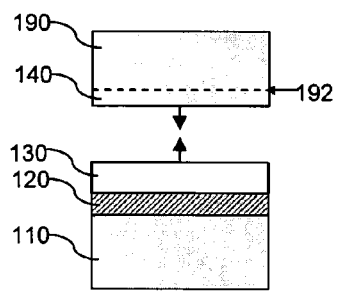
Figure 4H:
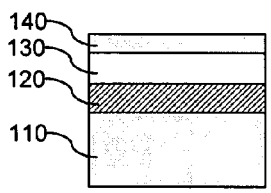

A second donor wafer comprising a silicon substrate 190 may be prepared. Optionally, the silicon substrate 190 may have an insulating layer disposed over it (not shown); for example such an insulating layer may be formed of silicon oxide and may be deposited and/or thermally grown. The silicon substrate 190 may then undergo ion implantation (indicated by arrows 191) so as to implant ions to be used for a second ion cut process. The ions implanted into the silicon substrate are provided with a suitable implantation energy so as to create an ion implant peak 192 at a desired depth from the surface of the silicon substrate 190. Such a process, in turn, defines a silicon layer 140 of the silicon substrate 190, which will be layer transferred to the handle wafer comprising silicon substrate 110. FIG. 4G illustrates a wafer bonding process wherein the surface of the silicon substrate 190 is bonded to layer 130 of the handle wafer. After wafer bonding the bonded pair may be annealed so as to initiate crack formation at the ion implant peak 192 of the silicon substrate 190 and therefore layer transfer silicon layer 140 onto layer 130 of the handle wafer, as shown in FIG. 4H. The resulting multilayer semiconductor wafer includes the layers of multilayer wafer 202 of FIG. 2B.

Figure 5A:
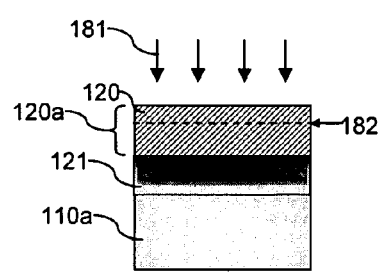
FIGS. 5A-5H are cross-section schematics illustrating another process for making a multilayer wafer, in accordance with one embodiment.
Figure 5B:
Figure 5C:
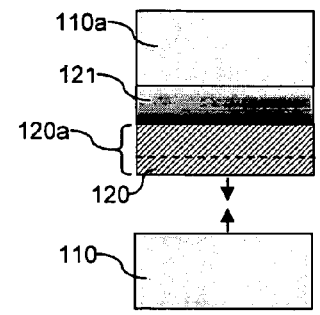
Figure 5D:
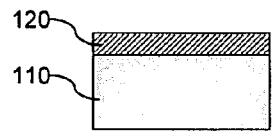
Figure 5E:
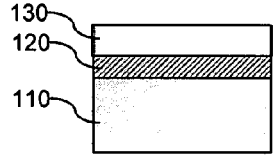
Figure 5F:
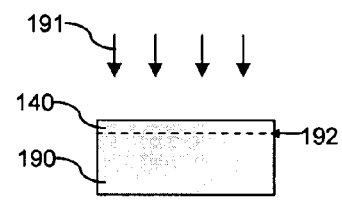
Figure 5G:
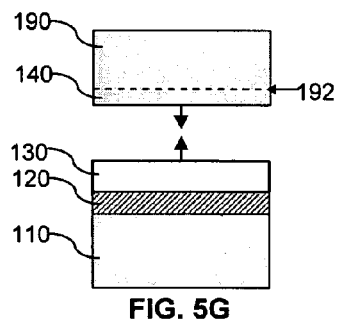
Figure 5H:
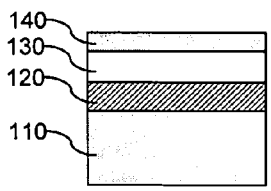
Figure 6A:
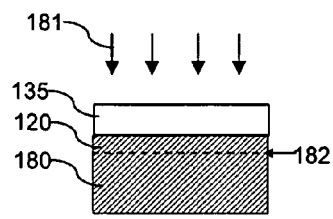
FIGS. 6A-6H are cross-section schematics illustrating another process for making a multilayer wafer, in accordance with one embodiment.
Figure 6B:
Figure 6C:
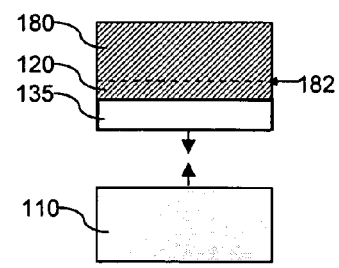
Figure 6D:
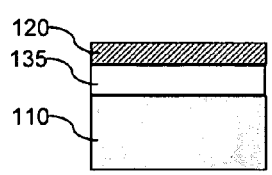
Figure 6E:
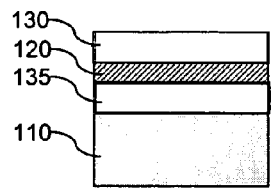
Figure 6F:
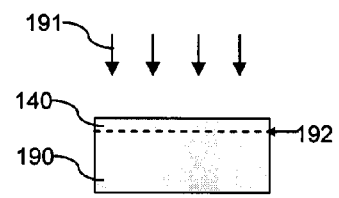
Figure 6G:
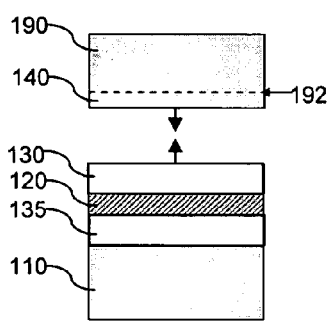
Figure 6H:
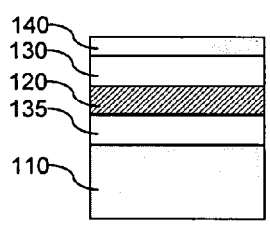
Figure 7A:
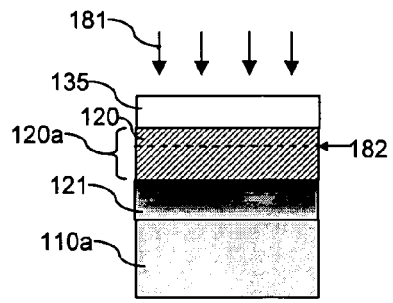
FIGS. 7A-7H are cross-section schematics illustrating another process for making a multilayer wafer, in accordance with one embodiment.
Figure 7B:
Figure 7C:
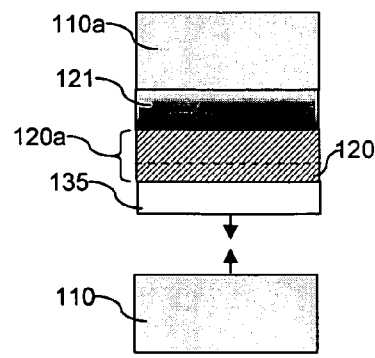
Figure 7D:
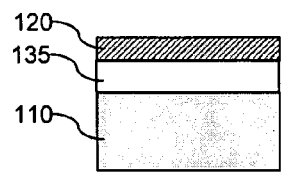
Figure 7E:
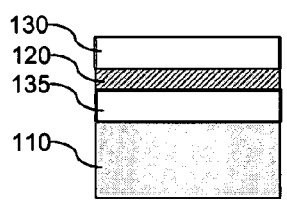
Figure 7F:
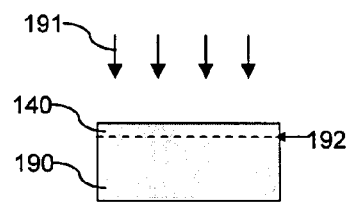
Figure 7G:
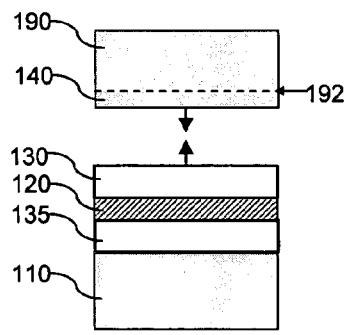
Figure 7H:
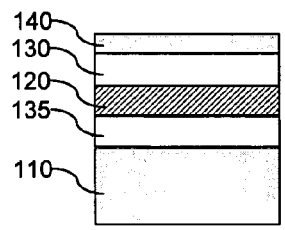

FIGS. 5A-5H illustrate an alternate method of making multilayer wafer 212 starting with a donor wafer comprising a non-silicon material such as germanium, silicon-germanium and/or III-V semiconductors, disposed over a silicon-germanium graded layer on a silicon substrate. FIG. 5A illustrates such a donor wafer comprising a silicon substrate 110*a* on which a silicon graded layer 121 is disposed. A germanium, silicon-germanium, and/or III-V layer 120*a* is disposed over the silicon-germanium graded layer 121. Ions can be implanted through the surface of the donor wafer so as to create an ion implant peak 182 at a desired depth in layer 120*a*. The material above the ion implant peak is labeled as layer 120 in FIG. 5A. The remaining acts in the method of FIG. 5 are similar to those described for the method of FIG. 4, except that the non-silicon donor substrate 180 is replaced by the wafer illustrated in FIG. 5A.

FIGS. 6A-6H illustrate a method of making a multilayer wafer 203 of FIG. 2C starting with a non-silicon substrate 180, such as a germanium or a III-V substrate, and using a method similar to that of FIG. 4. The acts of the method are similar to those described for FIG. 4, except that an insulating layer 135 is disposed over the non-silicon donor substrate 180 of FIG. 6A and/or the handle wafer 110 of FIG. 6B.

FIGS. 7A-7H illustrate another method of making multilayer wafer 203 using a starting wafer comprising a non-silicon layer, such a germanium, silicon-germanium, and/or III-V layers 120*a* deposited on a silicon-germanium graded layer 121 that has been deposited on a silicon substrate 110*a*. Insulating layer 135 may be deposited on the non-silicon layer 184 and/or on a handle silicon substrate 110. The remaining acts of the process of FIG. 7 are similar to those of FIG. 6.

A multilayer wafer such as multilayer wafer 100 shown in FIG. 1 comprises a monocrystalline semiconductor layer 120 having a lattice constant different from a lattice constant of relaxed silicon. Such a multilayer wafer may be used as a starting wafer to monolithically integrate silicon and non-silicon devices. Silicon devices may be formed in and/or on the monocrystalline silicon layer 140 and non-silicon devices may be formed in regions wherein the silicon layer 140 and the insulator layer 130 have been removed so as to expose the monocrystalline semiconductor layer 120. High quality semiconductor material layers epitaxially regrown on the exposed monocrystalline semiconductor layer 120 may serve as material layers for non-silicon devices, such as III-V, silicon-germanium, and/or germanium electronic and/or optoelectronic devices.

Figure 8:
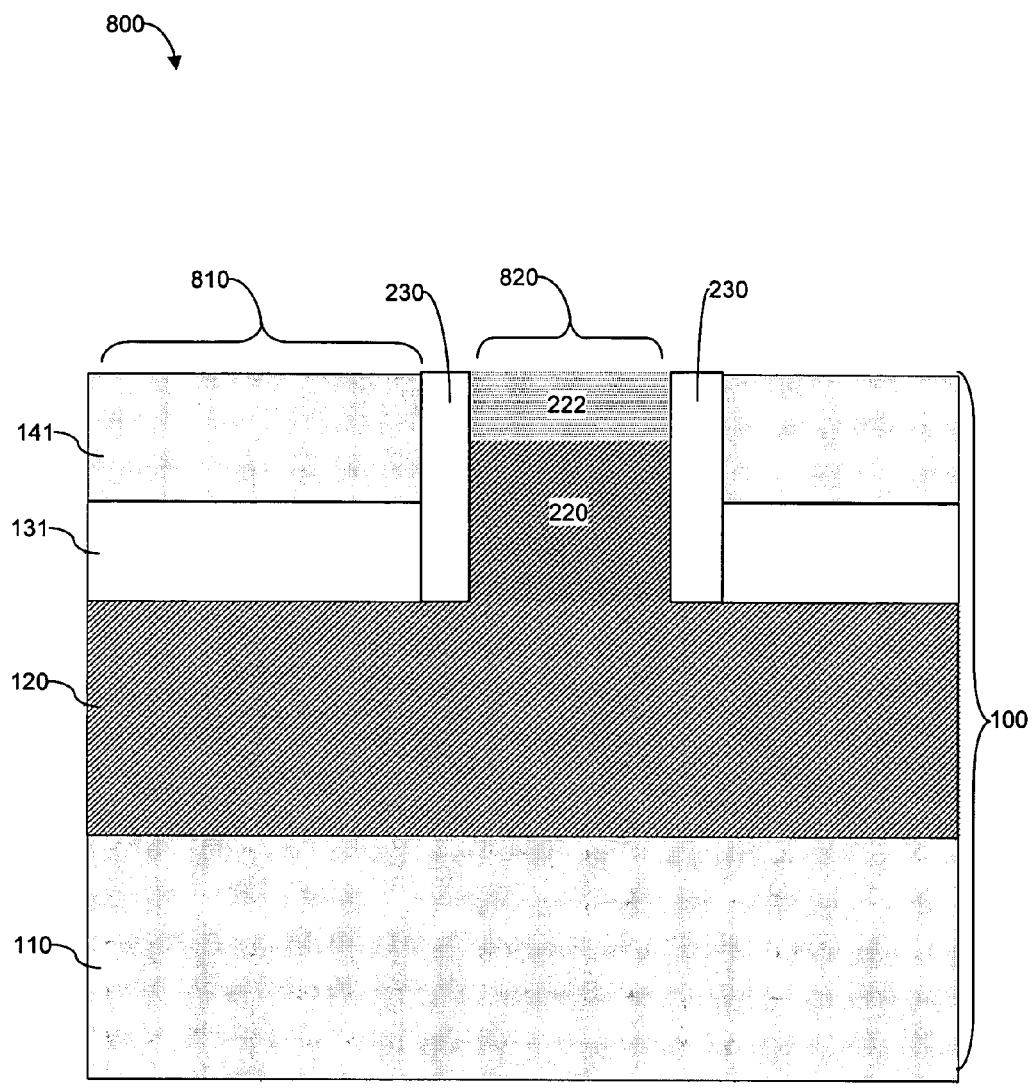
FIG. 8 is a cross-section schematic of a monolithically integrated semiconductor structure that may be formed using a multilayer starting wafer, in accordance with one embodiment.

FIG. 8 illustrates a semiconductor structure 800 that may be formed using multilayer wafer 100 as a starting wafer, in accordance with one embodiment. The semiconductor structure 800 monolithically integrates a first region 810 and a second region 820. The first region 810 can include a monocrystalline silicon layer 141 disposed over an insulating layer 131 which is further disposed over monocrystalline semiconductor layer 120, wherein the monocrystalline semiconductor layer 120 has a lattice constant different from a lattice constant of relaxed silicon. The monocrystalline semiconductor layer 120 is disposed over a silicon substrate 110.

Semiconductor structure 800 further comprises a second region 820 wherein a second monocrystalline semiconductor layer (e.g., layers 220 and 222 in the illustrated embodiment) is disposed over at least a portion of the monocrystalline semiconductor layer 120. The second monocrystalline semiconductor layer (e.g., layers 220 and 222) is absent from the first region of the semiconductor structure. The second monocrystalline semiconductor layer (220 and 222) has a lattice constant different from that of the relaxed silicon, and may have a composition different from that of monocrystalline semiconductor layer 120.

Monocrystalline semiconductor layer 220 may be disposed in contact with at least a portion of the first monocrystalline semiconductor layer 120. As shall be discussed further below, such a structure may be formed by epitaxial growth on an exposed region of the monocrystalline semiconductor layer 120. In some embodiments, monocrystalline semiconductor layer 220 may have a composition similar to that of monocrystalline semiconductor layer 120, or alternatively a portion or all of monocrystalline semiconductor layer 220 may have a composition different from monocrystalline semiconductor layer 120. Furthermore, layer 220 may be doped, in part or in whole, as desired for the intended device application.

Monocrystalline semiconductor layer 222 may be disposed over semiconductor layer 220, wherein semiconductor layer 222 may comprise heterostructures suitable for the intended devices to be formed in region 820. In some embodiments, semiconductor layer 222 may include one or a plurality of III-V semiconductor material layers, silicon-germanium, and/or germanium layers. In some embodiments, layer 222 may include a silicon cap layer which may be disposed in contact on III-V, silicon-germanium, and/or germanium material layers. The silicon cap layer may serve as an encapsulating layer that impedes III-V and/or germanium exposure to any processing environment used to fabricate devices on such a structure (e.g., a silicon foundry).

Applicants have appreciated the benefit of having substantially co-planar silicon device regions and non-silicon device regions. Coplanarity between the surfaces of silicon regions and non-silicon regions may facilitate photolithography process steps since both silicon regions and non-silicon regions may be at substantially the same height (e.g., silicon and non-silicon semiconductor surfaces are at substantially the same height). As such, photolithography steps, which may be sensitive to significant height variations on the surface of a wafer, may be facilitated. Interconnect fabrication between devices in the silicon region and the non-silicon region may also be facilitated as a result of the substantial coplanarity between the regions. As used herein, coplanarity may depend on the feature scale of the lithography processes employed. In some embodiments, coplanar semiconductor surfaces are less than 100 nanometers, less than 200 nanometers, or less than 400 nanometers apart. For instance, when using photolithography employed for 70 nanometer gate-length CMOS, the substantially coplanar surfaces may be less than 200 nanometers apart (e.g., less than 100 nanometers, less than 50 nanometers).

It should be appreciated that any number of other layers may be introduced in semiconductor structure 800. For instance, non-silicon regions 820 including monocrystalline semiconductor layers 220 and 222 may be isolated from monocrystalline silicon regions 141 by insulating layers 230. Although the illustration of FIG. 8 shows layers 230 disposed so as to fill the entire gap between the monocrystalline silicon layer 141 and the monocrystalline semiconductor layers 222 and 220, it should be appreciated that the techniques presented herein are not limited in this respect.

Figure 9:
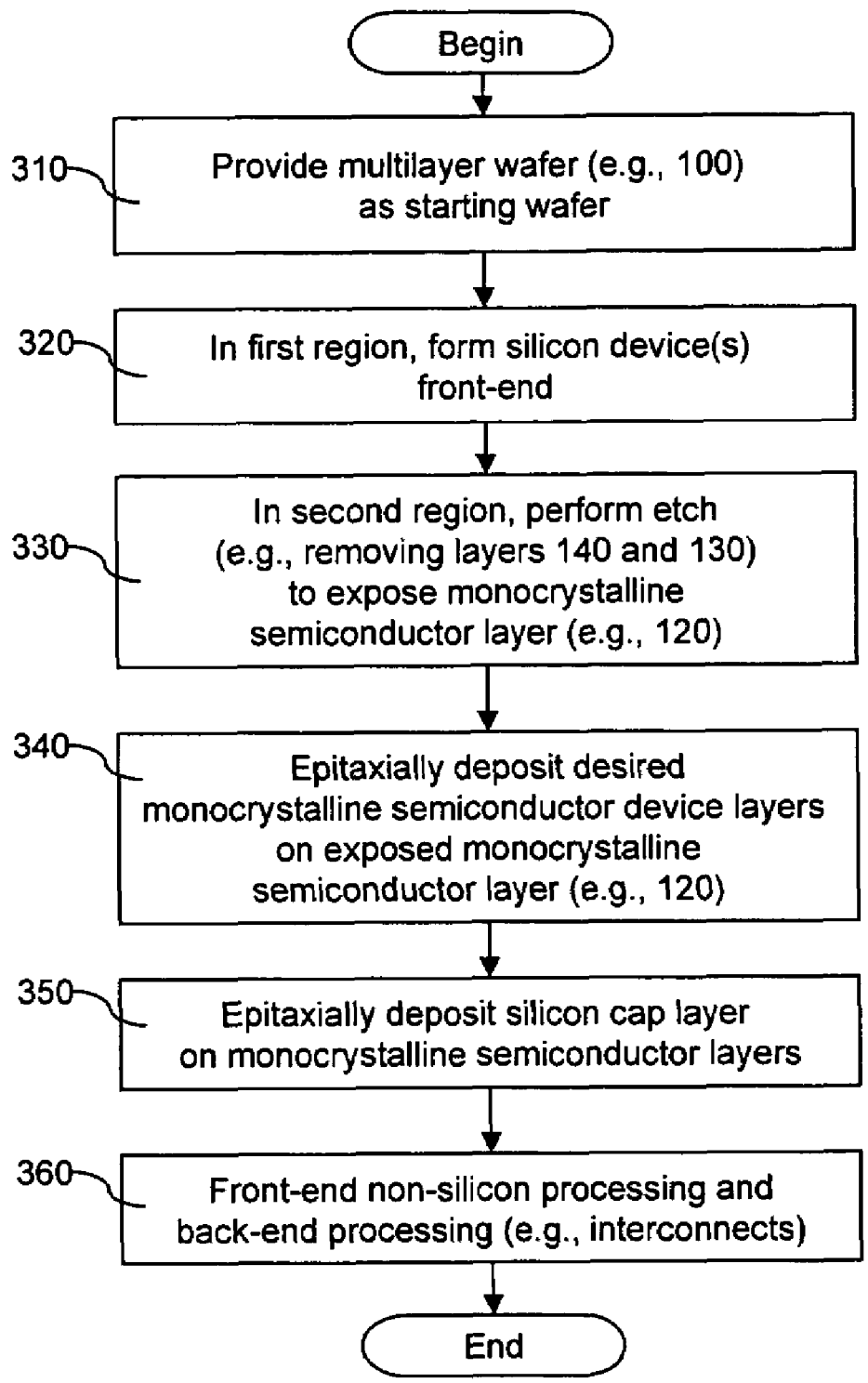
FIG. 9 is a flowchart of a method for forming a monolithically integrated semiconductor structure using a multilayer starting wafer, in accordance with one embodiment.

The monolithically integrated structures presented herein which combine monocrystalline silicon regions and monocrystalline non-silicon regions may be formed using fabrication processes that use a multilayer wafer, such as multilayer wafer 100, as a starting wafer. The flowchart of one example of such a method is illustrated in FIG. 9. The method may include providing a multilayer wafer (e.g., multilayer wafer 100) as a starting wafer (act 310). In act 320, a front-end silicon device process may be performed so as to form the front-end of silicon devices in first regions of the monocrystalline silicon layer 140. Such silicon devices may include electronic and/or optoelectronic devices, such as silicon transistors (e.g., CMOS, biopolars) and/or opto-electronic devices (e.g., silicon photodetectors). Optionally, the front-end of silicon devices fabricated in the first regions may be coated via the deposition of a protective material, including but not limited to nitrides, oxides, oxynitride, combinations thereof, or any other suitable material as is known to those skilled in the art.

In second regions of the silicon monocrystalline layer 140, the silicon monocrystalline layer 140 and the insulator layer 130 may be removed (e.g., etched) so as to expose the monocrystalline semiconductor layer 120 (act 330). Etches utilized to remove the silicon and/or insulator may include chemical or physical etches, and may be dry or wet etches, as the techniques presented herein are not limited in this respect. Once the monocrystalline semiconductor layer 120 is exposed in the second region, any desired semiconductor material layers may be epitaxially grown on the exposed regions which serve as seed layer for the epitaxial growth process (at 340). In this manner, semiconductor materials that are lattice-matched to the monocrystalline semiconductor layer 120 may be grown. The semiconductor layers grown on the monocrystalline semiconductor layer 120 may include germanium layers, silicon-germanium layers, III-V layers, and/or any combinations thereof. At least one of such layers has a lattice constant different than the lattice constant of relaxed silicon.

Optionally, prior to the epitaxial growth on the exposed semiconductor layer 120, insulating (e.g., dielectric) material may be deposited so as to surround the sidewalls of the monocrystalline silicon layer 141 (e.g., as shown for semiconductor structure 800) that has been exposed due to the etch in the second region. Such a process may result in the formation of insulating layers 230 as illustrated in FIG. 8. Such a process may involve depositing a blanket insulating layer over the whole wafer surface and etching part of the deposited blanket insulating layer so as to expose the monocrystalline semiconductor layer in region 820 while leaving intact the insulator on the sidewall of region 820. It should be appreciated that such insulating sidewalls 230 may be formed of dielectric materials such as oxide, nitrides, oxy-nitrides, and/or any combinations thereof or of other suitable materials. Upon the epitaxial growth of semiconductor 220 and 222 on semiconductor 120, the sidewalls 230 may facilitate selective epitaxial growth wherein the exposed monocrystalline semiconductor layer 120 serves as a seed layer for subsequent epitaxial growth. Growth on the insulator 230 may be inhibited via the use of appropriate growth chemistries, temperatures, and/or pressures, as is known by those of skill in the art. If a blanket insulating protective layer is present over the silicon regions 810, growth of the semiconductor may also be inhibited in these regions via the use of selective growth. Alternatively, if selective growth is not utilized, semiconductor growth may take place over the silicon regions 810, and a post-growth etch may be performed to remove any semiconductor material deposited in those regions.

Semiconductor epitaxial growth of act 340 may allow for the growth of desired device layers including III-V, germanium, and/or silicon-germanium layers. The epitaxial growth may also incorporate desired doping, such P-type, N-type, and intrinsic doping desired in device structures. Furthermore, a silicon capping layer may be deposited at the end of the growth process so as to encapsulate the III-V, germanium, and/or silicon-germanium layers regrown on the monocrystalline semiconductor layer 120 (act 350). Incorporation of silicon capping layer can facilitate reintroduction into a silicon fabrication facility after the epitaxial growth. In some embodiments, the epitaxially grown semiconductor layer surface (e.g., layer 222 or the silicon capping layer surface) in the second region can be substantially coplanar with the silicon surface in the first region (e.g., layer 141), as previously described above.

In act 360, front-end processing of the non-silicon devices and back-end processing for silicon devices in the first region and non-silicon devices in the epitaxially grown second region may be performed. Back-end processing may include forming interconnections between devices on the wafer. It should be appreciated that interconnections may be formed between silicon devices in the first region, between non-silicon devices in the second region, and between both silicon and non-silicon devices. Such a process is compatible with standard silicon fabrication facilities, and furthermore in the embodiment wherein the silicon and the non-silicon regions have semiconductor surfaces that are substantially coplanar, photolithography and interconnection processes in back-end processing may be significantly facilitated. Also, such a process may enable the entire process to be performed in a silicon CMOS fabrication facility. This process may be advantageous, since back-end processing technology may be more advanced for silicon CMOS fabrication facilities.

The fabrication process described may facilitate monolithic integration of silicon and non-silicon (e.g., III-V) devices since silicon CMOS front-end process temperatures are typically higher than temperatures that minimize dopant diffusion in III-V devices. Therefore, in some embodiments, III-V device layers may not be present in the wafer when silicon front-end processing is performed. However, the melting temperatures of III-V, germanium, and/or silicon-germanium buried monocrystalline semiconductors layers may be high enough to enable these layers to survive silicon front-end processing. Also, since back-end processing (e.g., interconnect formation) generally has a lower thermal budget that silicon front-end processing, any III-V device layers may readily survive silicon back-end processing.

Such monolithically integrated semiconductors structures, and associated methods for forming such structures, may be used to monolithically integrate silicon devices (electronic or optoelectronic) and III-V and/or germanium devices (electronic and/or optoelectronic).

Figure 10:
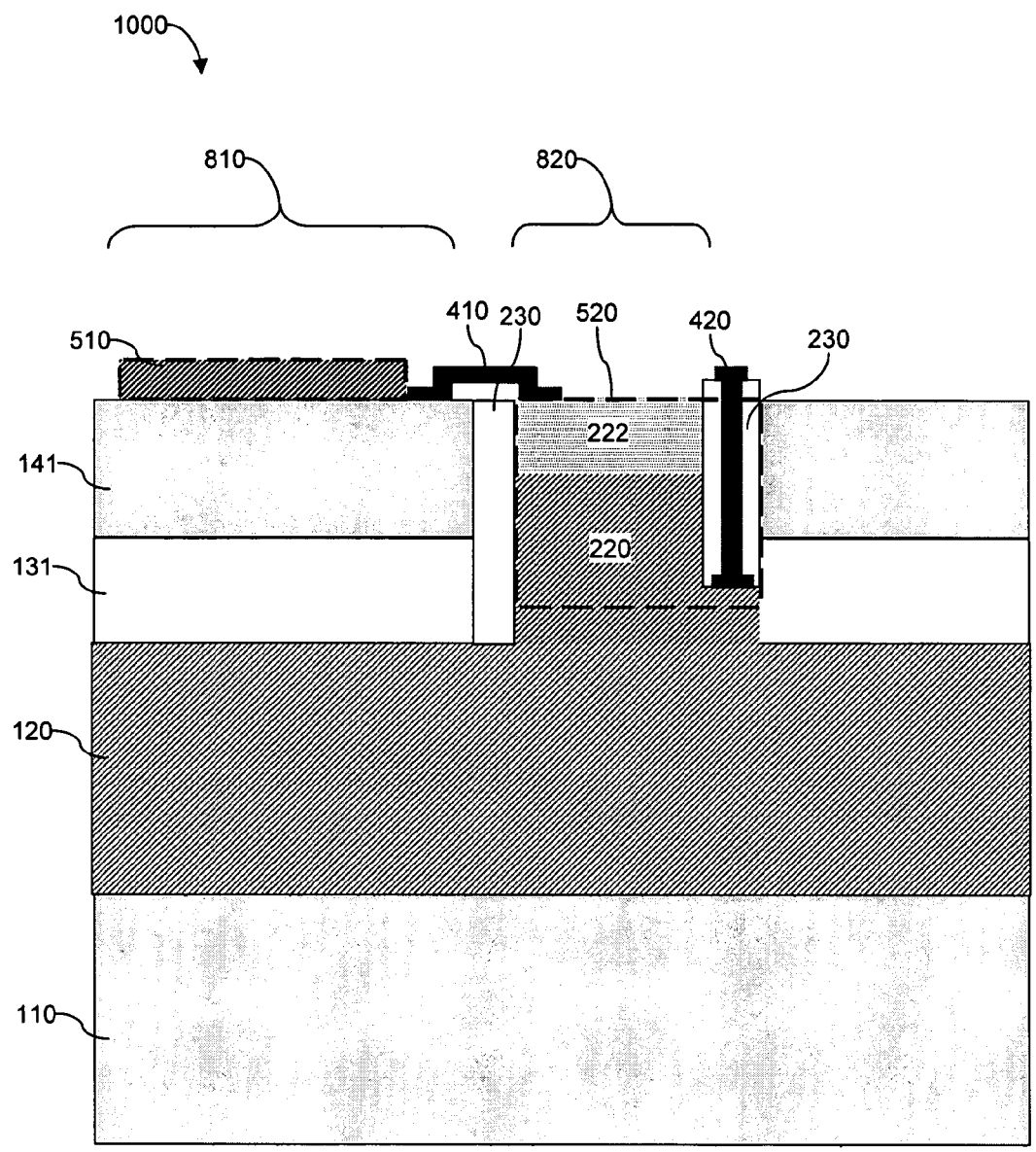
FIG. 10 is a cross-section schematic of an integrated device structure wherein silicon electronics are monolithically integrated with III-V light emitting devices, in accordance with one embodiment.

FIG. 10 illustrates an integrated device structure 1000 wherein silicon electronics are monolithically integrated with III-V light emitting devices (e.g., LEDs or laser diodes) in accordance with one embodiment. Silicon devices 510 (e.g., silicon CMOS, bipolar transistors, and/or silicon photodetectors) may be fabricated so as to reside in a first region 810 of the multilayer wafer, and III-V light emitting devices 520 may be grown on monocrystalline semiconductor layer 120 in a second region 820. Light emitting devices formed in region 820 may include a vertical stack of III-V layers doped so as to form a p-n or p-i-n structure. Layers 222 may also include an active layer (e.g., one or more quantum wells) and confinement layers disposed below and above the active layer. The surface of layer 222 may include a silicon capping layer, as previously described. The top of layer 222 of the light emitting devices 520 may be contacted and interconnected electrically with silicon devices 510 via interconnect 410. The other side of the vertical light-emitting device structure may be contacted through a metal-filled via 420, which may also be interconnected with silicon devices 510 (not shown). It should be appreciated that this is just one type of contacting scheme and others may be employed as the techniques presented herein are not limited in this respect.

Figure 11:
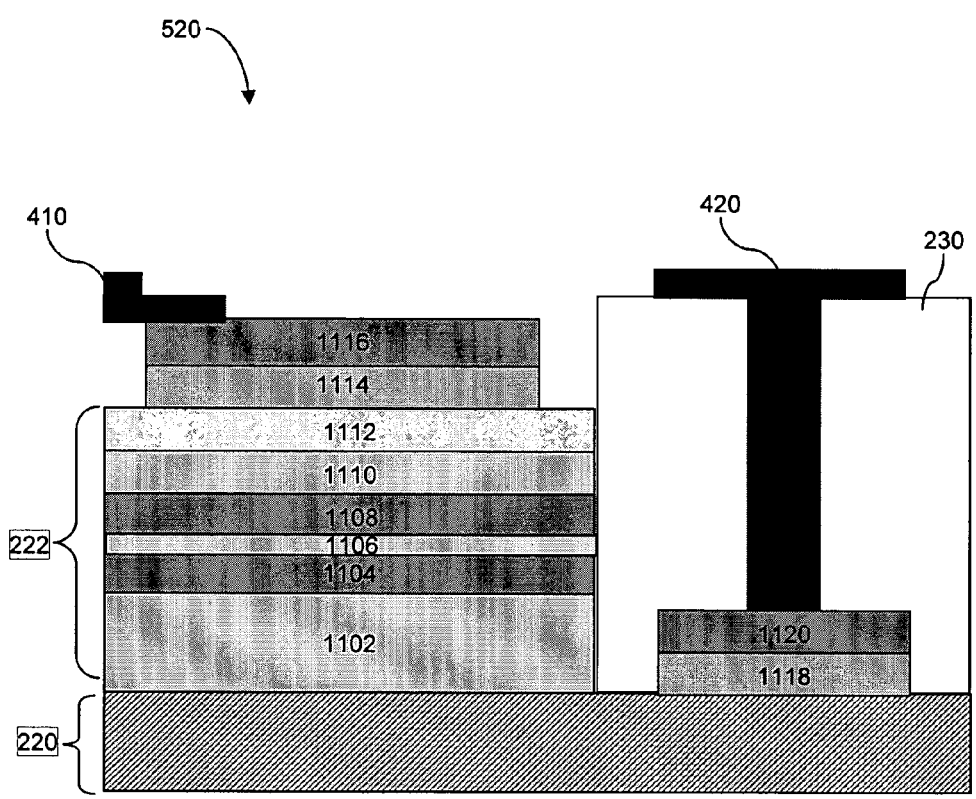
FIG. 11 is a cross-section schematic of a light emitting device structure, in accordance with one embodiment.

FIG. 11 illustrates a cross-section of a light emitting device structure 520' in accordance with one embodiment. Light emitting device structure 520' is an illustrative example of a light emitting device 520 of integrated device structure 1000. Light emitting device 520' includes a monocrystalline semiconductor layer 220 which may be a germanium layer. Layer 220 may be p+ doped and can serve as the p-side of the light emitting device. Semiconductor layer 222, disposed over the semiconductor layer 220, may include light emitting device confinement layers, cladding layers, active layers, and capping layers (e.g., a silicon capping layer). Layer 222 may include a p+ doped gallium arsenide layer 1102. A bottom p-type AlInGaP confinement layer 1104 may be disposed over layer 1102. A quantum well active layer 1106 may be disposed over the bottom confinement layer 1104. Quantum well 1106 may be undoped and be formed of InGaP so have to have a bandgap confinement due to the bandgap and/or bandgap offset with the surround confinement layers. A top n-type AlInGaP confinement layer 1108 may be disposed over the active layer 1106. An n+ doped gallium arsenide layer 1110 may be disposed over the confinement layer 1108. An n+ doped silicon capping layer 1112 may be disposed over layer 1110.

Gallium arsenide layer 1102 and cladding layers 1104 and 1108 may be doped with about $5 \times 10^{17}$ dopants/cm$^3$. Cladding layers 1104 and 1108 may be about 200 nm thick and the active region 1106 can be about 22 nm thick. Gallium arsenide layer 1110 may serve as a current spreading layer and may be about 50 nm thick and doped with about $1 \times 10^{19}$ dopants/cm$^3$. The silicon encapsulation layer 1112 may be about 80 nm thick and doped with about $1 \times 10^{21}$ dopants/cm$^3$. Alternatively, the doping order may be reversed so as to from an n-p doped heterostructure wherein bottom layers are n-doped and the surface layers are p-doped.

Light emitting device 520' can include silicide layer 1114 formed as a result of depositing a contact metal layer 1116 on silicon capping layer 1112. Contact metal layer 1116 may be disposed in contact with interconnect 410. Contact metal layer 1116 may only cover part of the light emitting device surface therefore allowing for light emission through regions that are not covered. For example, contact metal layer 1116 may have loop geometry as viewed from a top view. Light emitting device 520' can include a germanicide layer 1118 formed as a result of deposition a contact metal layer 1120 on germanium layer 220.

In some embodiments, a III-V heterostructure and a silicon capping layer is deposited in-situ in one reactor system (e.g., an MOCVD reactor) capable of depositing III-V and IV materials. For example, the III-V heterostructure and the capping silicon layer of light emitting device 520' may be grown using low pressure MOCVD (e.g., a Thomas Swan close-coupled showerhead reactor). Source materials can include trimethylgallium (TMGa), trimethylaluminum (TMAl), trimethylindium(TMIn) for column III elements, $PH_3$ and $AsH_3$ for column V elements and $SiH_4$ for silicon. Dimethylzinc (DMZn) and $B_2H_6$ can be employed as p-type dopant sources and $Si_2H_6$ may be employed as an n-type dopant source. The carrier gas may include nitrogen. Deposition may be carried out at a wafer temperature of about 650° C. and pressure of about 100 Torr. V/III ratio can be set to about 83 for the deposition of the light emitting device layers.

It should be appreciated that light emitting device 520' is only one example of a semiconductor layer structure for a light emitting device. In some embodiments, the light emitting device may include a heterostructure, whereas in other embodiments the light emitting device may include a homostructure. Other III-V materials may be used to form light emitting device structures that emit light of differing wavelengths, as the techniques presented herein are not limited in this respect. In the light emitting device of 520', the AlInGaP layers may be $(Al_xGa_{1-x})_{0.5}In_{0.5}P$ layers (e.g., x=0.3) lattice matched to GaAs, which may serve as a material for a high-brightness visible light emitting device in the red to green region of the visible light spectrum.

Figure 12:
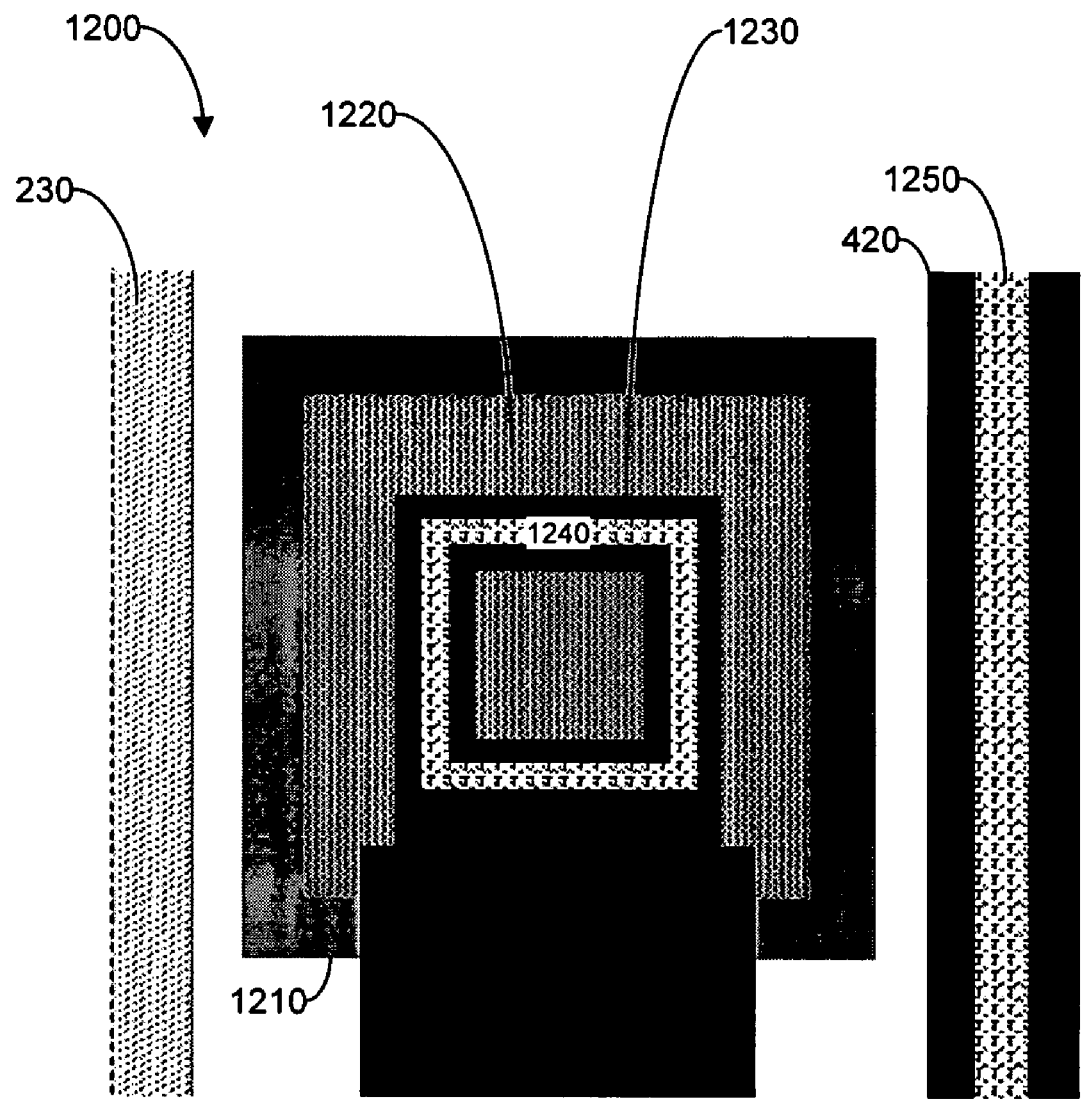
FIG. 12 is a top view schematic of a light emitting device structure, in accordance with one embodiment.

FIG. 12 illustrates a top view 1200 of a light emitting device monolithically integrated on a multilayer wafer, such as multilayer wafer 100, in accordance with one embodiment. For example, light emitting device 520 of monolithically integrated device structure 1000 can be fabricated to have a top view 1200. The light emitting device can include an insulating region 230 (e.g., an isolation trench) which may be formed of any suitable electrically insulating material, such as an oxide (e.g., silicon oxide), silicon nitride, or combination thereof. The light emitting device can include a growth well 1210 within which the light emitting device heterostructure (or homostructure) may be epitaxially grown on a monocrystalline semiconductor layer (e.g., layers 220 and 222) of a multilayer starting wafer (e.g., multilayer wafer 100). The light emitting device can have an emitting area 1220 from which light generated within the light emitting device active area may at least partially be emitted from. The light emitting device may be contacted in any suitable manner. As shown in top view 1200, a first metal contact 1230 may contact the top-side of the light emitting device semiconductor structure through contact via 1240, and a second metal contact 420 may contact the bottom-side of the light emitting device semiconductor heterostructure through contact via 1250.

The light emitting device emission area may have any suitable dimensions and shape. In the top view shown in FIG. 12, the light emitting device emission area is rectangular or square, although other shapes may also be used, as the techniques presented herein are not limited in this respect. The dimensions of the light emitting device semiconductor area may be defined by the dimensions of the growth well. As previously described, the growth well may be formed by starting with a multilayer wafer 100 and removing (e.g., etching) monocrystalline semiconductor layer 140 and insulator layer 130 in regions where light emitting devices (or other non-silicon devices or materials) may be formed via epitaxial growth on the exposed monocrystalline semiconductor layer 120. The dimensions of the light emitting device emission area may therefore be defined by the lithography process used to form the growth well. In one embodiment, the light emitting device emission area is less than about 100×100 μm². Since the emission area may be limited by the resolution of the lithography process (e.g., CMOS feature length lithography limit) employed to define the growth wells, in some embodiments the light emitting device emission area may be defined to be less than about 1×1 μm².

A plurality of growth wells and hence separate light emitting devices may be defined, where one or more light emitting devices may be isolated by an isolation trench, such as that formed by insulating layer 230. The isolation trench may have any suitable dimensions, as the techniques presented herein are not limited in this respect. In some embodiments, the pitch of each light emitting device unit, including isolation trenches and contact layers is less than about 100 μm.

In some embodiments, when selective epitaxial deposition of the light emitting device semiconductor structure is not employed, the material growth near the sidewalls (e.g., insulating sidewalls, such as dielectric sidewalls) of the growth well may be polycrystalline. In such embodiments, after the epitaxial growth in the wells, an etching processes may be used to remove polycrystalline semiconductor grown in regions other than the desired emission areas (e.g., area 1220).

It should be appreciated that if an array of light emitting devices is formed, then the light emitting devices in the array can share a same bottom contact (e.g., contact 420). Also, as illustrated in FIG. 12, the top contact (e.g., the p-contact) and/or the top contact via may have an annular configuration so as to promote current spreading while also promoting light emission from the surface of the light emitting device. In some embodiments, when the pitch of the light emitting devices in an array is small (e.g., having an emission area less than about 20×20 μm²), finger-shaped top contacts and/or fan-out to bond-pads may be incorporated into the light emitting device array.

FIG. 13 illustrates an example of a method of fabricating a light emitting device structure monolithically integrated on a multilayer wafer, such as multilayer wafer 100, in accordance with one embodiment. Such a process, potentially having a different heterostructure and/or contacting scheme, may be utilized to form other non-silicon material heterostructures and/or devices on a multilayer wafer.

The process may include providing a multilayer wafer, such as multilayer wafer 100. Front-end silicon device processing may be performed in first regions (regions 141) of the multilayer wafer on monocrystalline silicon layer 140 of a multilayer starting wafer 100. The multilayer wafer may be spin-coated with photoresist and pre-baked at 90° C. for 30 min. A lithography mask may then be used to develop and pattern the photoresist so as to expose regions of the multilayer wafer in which the light emitting devices will be formed.

Next, the monocrystalline silicon layer 140 and insulating layer 130 of the multilayer wafer may be etched to reveal the underlying monocrystalline semiconductor layer 120 in areas designated for light emitting device array fabrication. With positive photoresist as an etchmask, Electron Cyclotron Resonance Reactive Ion Etching (ECR-RIE) may be used to dry etch the monocrystalline silicon layer 140. Process conditions may include a $SF_6:O_2$ (30:5 sccm) etch chemistry, a total pressure of 30 mTorr, a source power of 400 W and bias power of 30 W. Using the same etchmask, a buffered oxide etch (BOE) solution may be employed to etch the insulating layer 130.

The exposed monocrystalline semiconductor layer 120 may then be isolated using a similar ECRRIE recipe as above with a positive photoresist as an etchmask. A timed etch may be used to define isolation trenches 1320 (e.g., ~1 µm deep). The trenches in conjunction with a reverse biased p-n junction inserted below the light emitting devices may provide electrical isolation between light emitting devices in a one-dimensional array, thus allowing operation of a two-dimensional passive matrix of light emitting devices. A conformal PECVD oxide (e.g., 1.2 µm thick) layer may then be deposited on the wafer. The oxide layer may provide a template for epitaxy and/or fill the isolation trenches 1320 with an oxide layer 1330. A BOE solution with a positive photoresist as an etchmask may be used to etch growth wells in the oxide layer so as to expose the underlying monocrystalline semiconductor layer 120 for epitaxial growth.

Figure 13A:
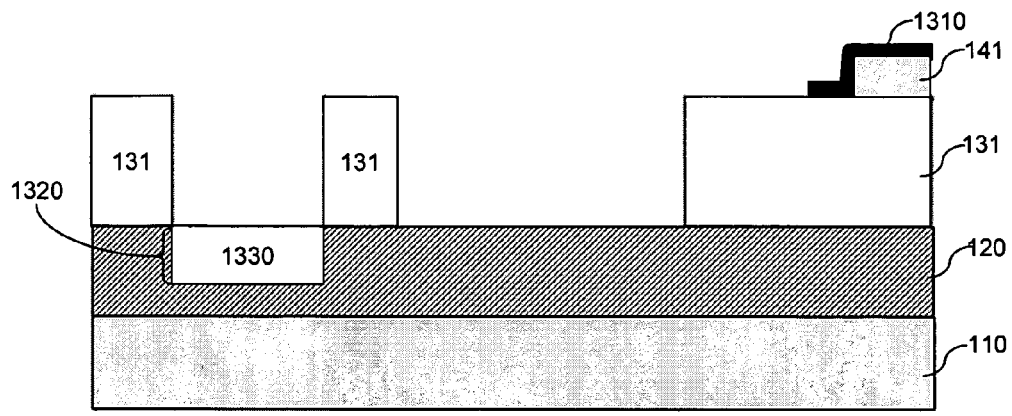
FIGS. 13A-13C are cross-sections schematics illustrating a method of fabricating a light emitting device structure monolithically integrated on a multilayer wafer, in accordance with one embodiment.

The wafer may then be cleaned so as to ensure that it is free from all photoresist residues prior to growth (e.g., MOCVD). A commercial photoresist stripper (e.g., Microstrip 2001® by Fujifilm) in addition to a one-hour oxygen plasma ash process may be used to prepare the wafer for growth of the light emitting device semiconductor structure. FIG. 13A shows a schematic cross-section of a portion of the patterned wafer just prior to MOCVD growth. As shown in FIG. 13A the silicon region 141 on which front-end silicon devices may have been fabricated may be protected with a protective layer 1310, which may be formed of any suitable material layer(s), such nitride, oxynitride, and/or oxide.

It should be appreciated that the monocrystalline semiconductor layer 120 may include any semiconductor having a lattice constant other than that of relaxed silicon. In some embodiments the monocrystalline semiconductor layer 120 may include a germanium layer that may be used for growth of a non-silicon heterostructure. In such embodiments, a germanium pre-growth clean may be used comprising of a 10:1 DI:HF clean for 15 s, followed by a $H_2O_2$ clean for 15 s, and then followed by a 10:1 DI:HF clean for 15 s. In other embodiments wherein the monocrystalline semiconductor layer 120 includes other materials intended to be used as growth layers, other suitable pre-growth cleans may be used, as is known by those skilled in the art. After a pre-clean, the patterned wafers may be loaded into a reactor (e.g., MOCVD reactor) for growth.

Figure 13B:
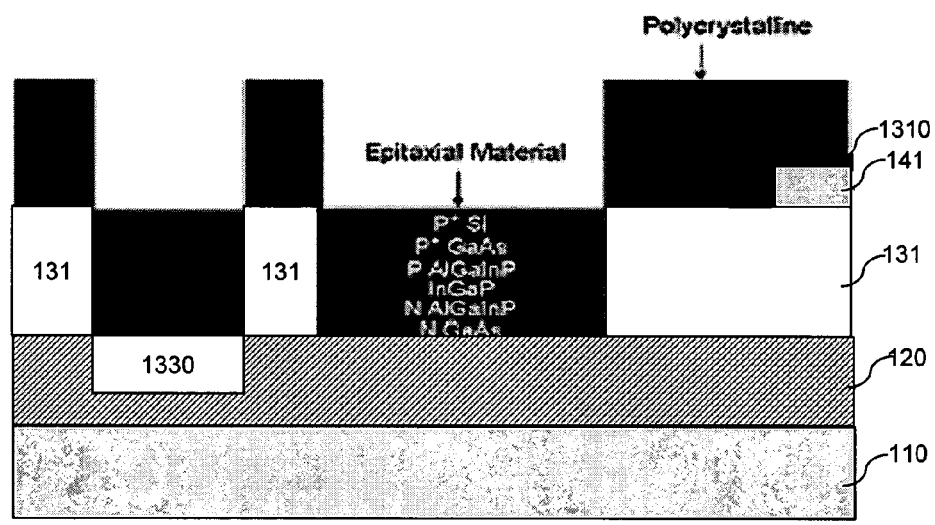

In embodiments where the growth conditions are selected to promote selective epitaxial growth, monocrystalline layers may be selectively grown on the exposed monocrystalline semiconductor layer 120 and no significant growth may take place on dielectric surfaces, such as growth well sidewalls. If non-selective growth is performed, polycrystalline material may be deposited on any insulating layers (e.g., dielectric layers) and in the growth wells near insulating (e.g., dielectric) sidewalls, while material may grow epitaxially in the central area of the growth wells, as shown in FIG. 13B. Although FIG. 13B illustrates a specific heterostructure grown on the underlying monocrystalline layer 120, it should be appreciated that other materials and/or heterostructures may be grown, as the techniques presented herein are not limited in this respect.

After growth, monocrystalline epitaxial material deposited in the growth wells may be protected using an oxide hard mask (e.g., a 3000-Å-thick PECVD oxide) and any polycrystalline material may be etched. In embodiments where the grown layers include a silicon capping layer, the silicon capping layer may be dry etched using a $SF_6/O_2$ plasma. For the heterostructure illustrated in FIG. 13B, the top GaAs current spreading and bottom GaAs buffer layers may be wet chemical etched using a $H_3PO_4:H_2O_2:H_2O$ (3:1:50) solution. A $HCl:H_3PO_4:H_2O$ (1:1:1) solution may be used to etch the AlGaInP/InGaP/AlGaInP stack. After etching is complete, the oxide hard mask may be stripped using a BOE solution.

Figure 13C:
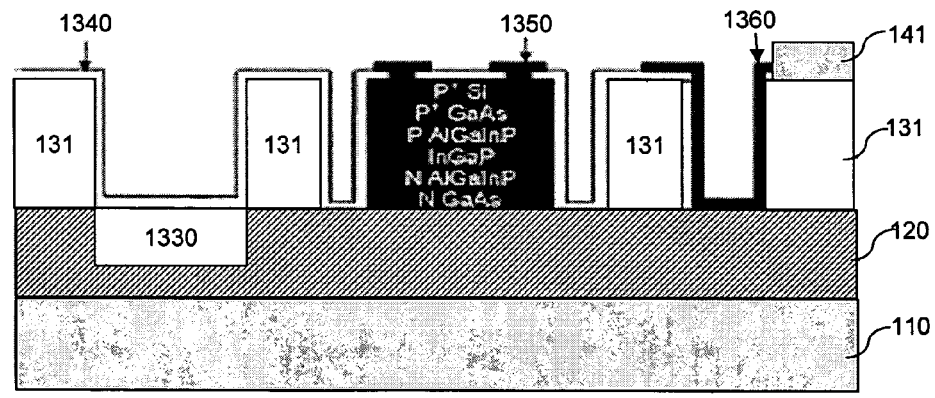

As shown in FIG. 13C, a conformal oxide layer 1340 (e.g., 3000 Å thick PECVD oxide) may then be deposited to insulate the light emitting device mesa sidewall. Sidewall insulation can prevent the top contact metal from shorting the light emitting device p-n junction at the mesa sidewall and also prevents exposure of III-V material at the light emitting device sidewalls during subsequent processing steps. Top and bottom contact vias may then be etched in the oxide (e.g., using a BOE solution) to expose the silicon capping layer and the monocrystalline semiconductor layer 120 for subsequent ohmic contact formation. A metal contact layer (e.g., 500 Å Ti/1 µm Al) may be sputter-deposited on the wafer and patterned into the top 1350 and bottoms 1360 contacts of the light emitting device (e.g., using a DI: BOE (1000:15) solution and a PAN etch (77% Phosphoric acid, 20% Acetic acid, 3% Nitric acid)).

The process may then include removing protective layer 1310 used to protect the silicon front-end during the growth and fabrication of the non-silicon devices (e.g., light emitting devices). Silicon back-end processing may then be performed to complete the fabrication of the silicon devices in region 141. The back-end processing may include forming metal interconnections between the silicon and non-silicon devices. Various modifications may be applied to the process described above, including but not limited to, forming other types of heterostructures for non-silicon devices, such as heterostructures for non-silicon electronic devices (e.g., HEMTs, HBTs, MESFETs) and/or optoelectronic devices (photodetectors, laser diodes), as shall be described further below. Also, any number of non-silicon devices may be formed using such a method and may be interconnected as desired to form monolithically integrated silicon and non-silicon devices.

Figure 14:
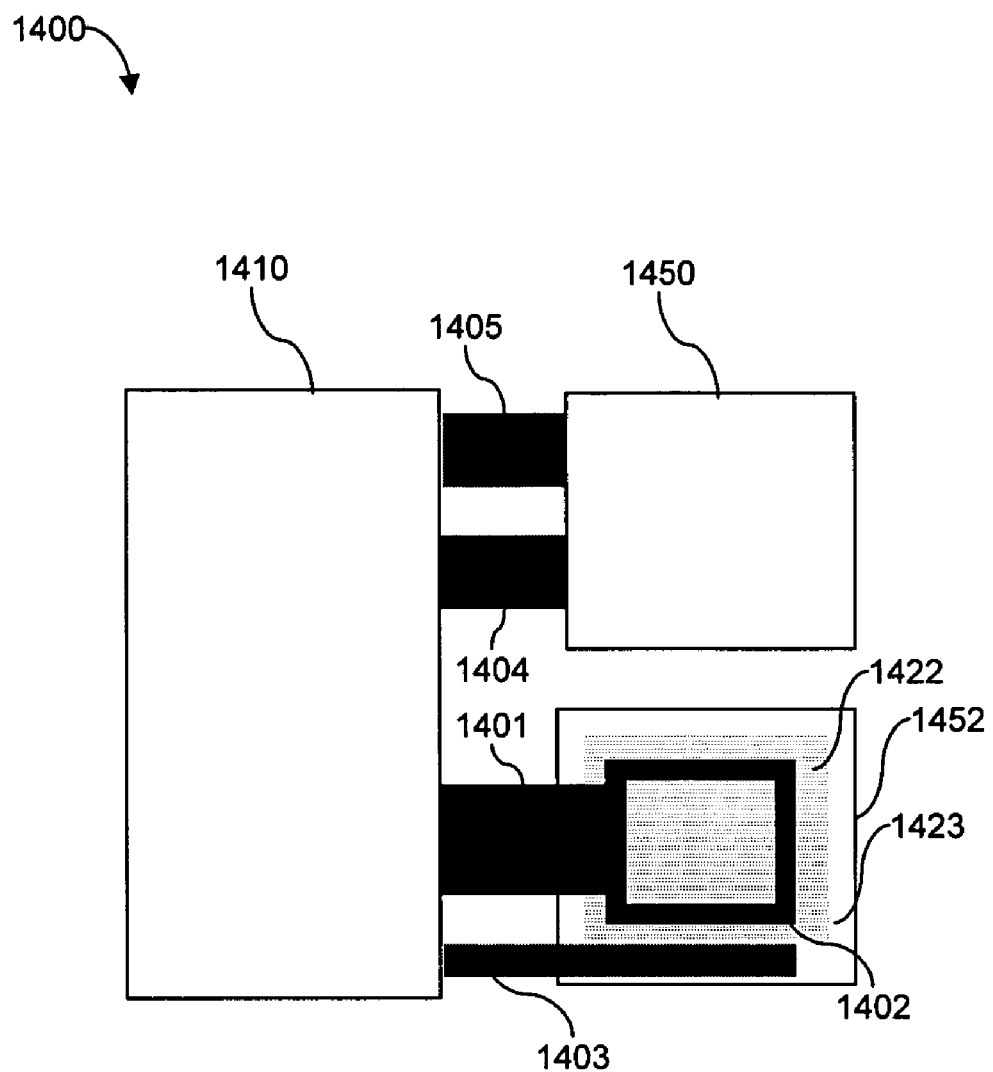
FIG. 14 is a top view schematic of an integrated device structure comprising silicon electronics monolithically integrated with a light emitting device and a silicon photodetector, in accordance with one embodiment.

FIG. 14 illustrates a top view of an integrated device structure comprising silicon electronics 1410 monolithically integrated with a light emitting device 1452 and a silicon photodetector 1450, in accordance with one embodiment. Such an integrated device structure may be formed using a multilayer wafer, such as multilayer wafer 100. The integrated structure may have silicon electronic and optoelectronic (e.g., silicon photodetector 1450) devices formed on a first region of the multilayer wafer, such as region 810 of FIG. 10. The silicon electronics 1410 and silicon photodetector 1450 may be formed on a monocrystalline silicon layer (e.g., layer 141 of FIG. 10). The light emitting device 1452 may be formed in regions of the multilayer wafer wherein the silicon monocrystalline layer of the starting multilayer wafer has been removed, thereby exposing a monocrystalline semiconductor layer 120 disposed under the monocrystalline silicon layer and having a lattice constant different than that of relaxed silicon. The device layers, for example the heterostructure layers of the light emitting device 1452, may be epitaxially grown on the exposed monocrystalline semiconductor layer having a lattice constant different than that of relaxed silicon (e.g., layer 120 of FIG. 10), as previously described.

The light emitting device 1452 may be an LED comprising an active region having a material that can emit light in a desired wavelength or wavelength range, such as a suitable III-V material. The semiconductor structure layers of light emitting device 1452 may be epitaxially grown as described in the method of FIG. 9. The top view presented in FIG. 14 shows the top contacting semiconductor layer 1422 of the light emitting device 1452. As previously described, the top contacting semiconductor layer 1422 may be a silicon capping layer, which may be deposited via epitaxial growth. The top view of the light emitting device 1452 also shows an insulating region 1423 which may surround the light emitting device semiconductor material and isolate the light emitting device from the silicon layer on which the silicon electronics and/or optoelectronics may be formed. Light emitting device 1452 may further comprise a top metal contact 1402, which may have a ring-like geometry. The top metal contact 1402 may be connected to an interconnect 1401 which may comprise a standard silicon interconnect metal. The interconnect 1401 may provide a connection with the silicon electronics 1410. The bottom of the light emitting device 1452 may be contacted by interconnect 1403 which may be disposed in contact with a metal filled via that extends through insulating layer 1423 and contacts the bottom semiconductor layer of the light emitting device 1452 (as shown in the cross section of FIG. 10).

The integrated device structure 1400 may include silicon photodetector 1450, which may have any suitable photodetector device configuration. In one embodiment, the silicon photodetector is a lateral p-n junction and/or a p-i-n junction. Such a structure may be formed via implantation of p-type and n-type dopants in select regions. In another embodiment, the silicon photodetector 1450 is a vertical silicon photodetector formed via implantation of p-type and/or n-type dopants and/or via selective epitaxial growth. The p and n regions (not shown) of the silicon photodetector 1450 may be contacted with interconnects 1404 and 1405 which may provide interconnection between the silicon photodetector 1450 and the silicon electronics 1410.

Silicon electronics 1410 may include silicon CMOS, silicon bipolar transistors, silicon-germanium HBTs, and/or associated circuit elements such as diodes, resistors, capacitors, and/or inductors. Silicon electronics 1410 may perform a variety of functions. Silicon electronics may provide drive power to the light emitting device 1452. Silicon electronics 1410 may also control the drive power provided by the light emitting device in response to signals provided by other circuits not shown herein, such as external circuits providing a display signal. Silicon electronics 1410 may receive a signal from photodetector 1450 which may be used to regulate the control of the light emitting device 1452. Alternatively, or additionally, the signal from silicon photodetector 1450 may be processed by digital circuits in the silicon electronics and used for purposes other than regulating the control of the light emitting device 1452.

Silicon photodetector 1450 may be used to accomplish various functions. In one embodiment, silicon photodetector 1450 may be used to monitor whether the light emitting device 1452 is operational and the signal provided by the silicon photodetector may be provided to the silicon electronics 1410 which can respond accordingly (e.g., turn on a backup light emitting device if light emitting device 1410 is malfunctioning and/or vary the drive power supplied to the light emitting device 1452). In another embodiment, the silicon photodetector may be used in an optical interconnect scheme and/or for imaging purposes, as described further below.

Figure 15A:
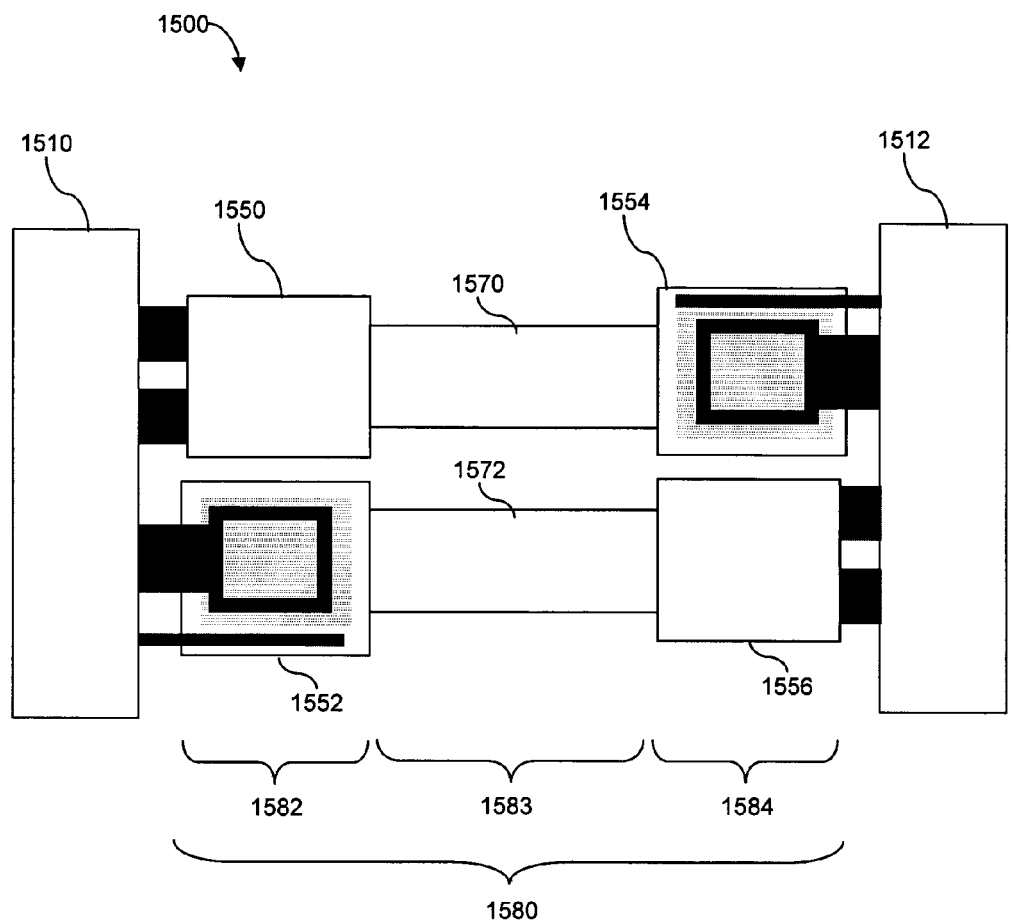
FIGS. 15A-15B are schematics of a monolithically integrated optical interconnect bus, in accordance with one embodiment.
Figure 15B:
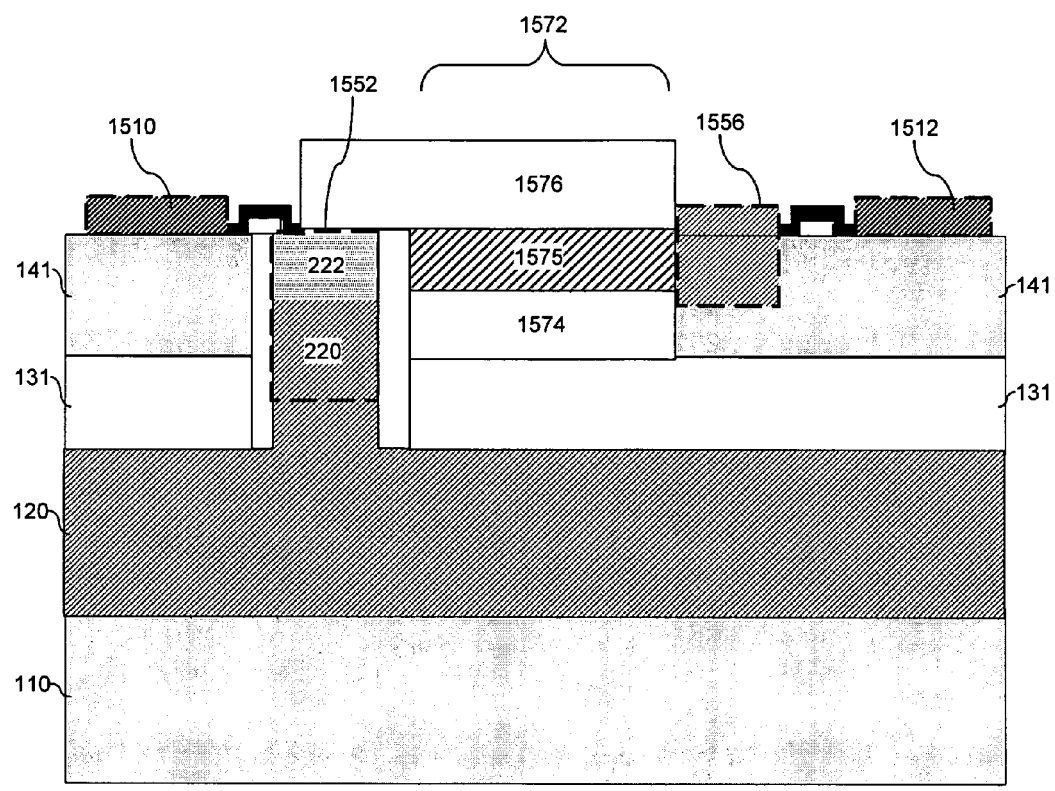

FIGS. 15A-15B illustrate a monolithically integrated optical interconnect bus, in accordance with one example embodiment. Integrated device system 1500 may include monolithically integrated silicon electronics 1510 and 1512 situated in separate regions of a multilayer wafer, such as multilayer wafer 100 illustrated in FIG. 1. Silicon electronics 1510 may communicate with silicon electronics 1512, and vice versa, via optical interconnect bus 1580, as illustrated in FIG. 15A. Optical interconnect bus 1580 may include optical transceiver 1582 in electrical communication with silicon electronics 1510 and optical transceiver 1584 in electrical communication with silicon electronics 1512. The optical interconnect bus may include one or more waveguides allowing for optical communication between optical transceivers 1582 and 1584. Optical transceiver 1582 may include light emitting device 1552 which may be controlled by silicon electronics 1510 via metal interconnects. Optical transceiver 1582 may further comprise silicon photodetector 1550 which may be electrically interconnected with silicon electronics 1510. Optical transceiver 1584 may include light emitting device 1554 in electrical communication via interconnects with silicon electronics 1512. Optical transceiver 1584 may also include silicon photodetector 1556 in electrical communication with silicon electronics 1512 via metal interconnects.

One or more waveguides 1583 may provide for optical communication between optical transceiver 1582 and 1584. The one or more waveguides 1583 may comprise optical waveguide 1570 arranged so as to provide for an optical communication channel from light emitting device 1554 to silicon photodetector 1550. Optical waveguide 1572 may provide for an optical communication channel from light emitting device 1552 to silicon photodetector 1556.

Optical interconnect bus 1580 may enable optical communication between silicon electronics 1510 and 1512. During operation, when silicon electronics 1510 determines that information is to be communicated to silicon electronics 1512, a modulated drive power (e.g., encoded with desired information to be communicated) may be provided to light emitting device 1552 so as to generate light which may travel, at least partially, through waveguide 1572 and may be detected by silicon photodetector 1556. An electrical output signal may be provided by silicon photodetector 1556 to silicon electronics 1552, which in turn may process the signal from an analog to a digital domain. In this manner, signals having encoded information (e.g., digitally encoded) may be communicated optically between silicon electronics in different regions of a multilayer wafer, such as multilayer wafer 100. Similarly, silicon electronics 1512 may modulate a drive power provided to light emitting device 1554 so as to encode a signal. Light emitting device 1554 may emit light which may travel, at least partially, along waveguide 1570 and can be detected by photodetector 1550. Silicon detector 1550 can provide an electric output signal to silicon electronics 1510, which may convert the analog electrical signal provided by silicon photodetector 1550 to a digital signal for further processing.

Such optical bus interconnects, when monolithically integrated with silicon electronics, may facilitate communication between silicon electronics (e.g., silicon digital CMOS electronics) separated by large distances on chip. Although the embodiment illustrated in FIG. 15A shows one light emitting device and one photodetector for each silicon electronics region (e.g., 1510 and 1512), it should be (appreciated that multiple light emitting devices and/or multiple silicon photodetectors may be electrically coupled to one silicon electronics module (e.g., silicon electronics 1510 or 1512). Furthermore, different light emitting devices may have different emission wavelengths, as may result from using a different material having differing bandgaps for an active region and/or resulting from different sized quantum wells in the active region (e.g., thereby resulting in varying the quantum confinement and hence the emission wavelength). Alternatively, or additionally, a time division and/or frequency division multiplexing scheme may be used so as to encode information for transmission via the optical bus 1580, as should be appreciated by those of skill in the art.

The optical bus illustrated in the embodiment of FIG. 15A may be fabricated on a multilayer wafer, such as multilayer wafer 100 illustrated in FIG. 1. FIG. 15B illustrates a cross-section of such an embodiment, wherein light emitting device 1552 may be fabricated to be a laterally emitting light emitting device, thereby emitting at least some light laterally, which in turn may be guided by waveguide 1572 to silicon photodetector 1556.

Optical waveguide 1572 (and/or 1570) may comprise a waveguide core 1575. The optical waveguide may also comprise waveguide cladding layers 1574 and 1576. Waveguide core 1575 may have a larger index of a refraction than waveguide cladding layers 1574 and 1576, thereby providing optical confinement for light emitted by light emitting device 1552. Waveguide core 1575 may comprise silicon nitride and/or silicon oxynitride and waveguide cladding layers 1574 and/or 1576 may comprise silicon oxide. Alternatively, waveguide core 1575 may comprise a silicon layer and cladding layers 1574 and/or 1576 may comprise any material having an index of a refraction smaller than that of the waveguide core, for example, silicon oxide, and silicon oxynitride, and/or silicon nitride. In some embodiments, the waveguide core 1575 is formed of a monocrystalline silicon layer, such as part or all of monocrystalline silicon layer 140 of multilayer wafer 100. Cladding layers 1574 and/or 1576 may be deposited and/or grown (e.g., via thermal oxidation of monocrystalline silicon layer 140), as is known by those of skill in the art.

Figure 16:
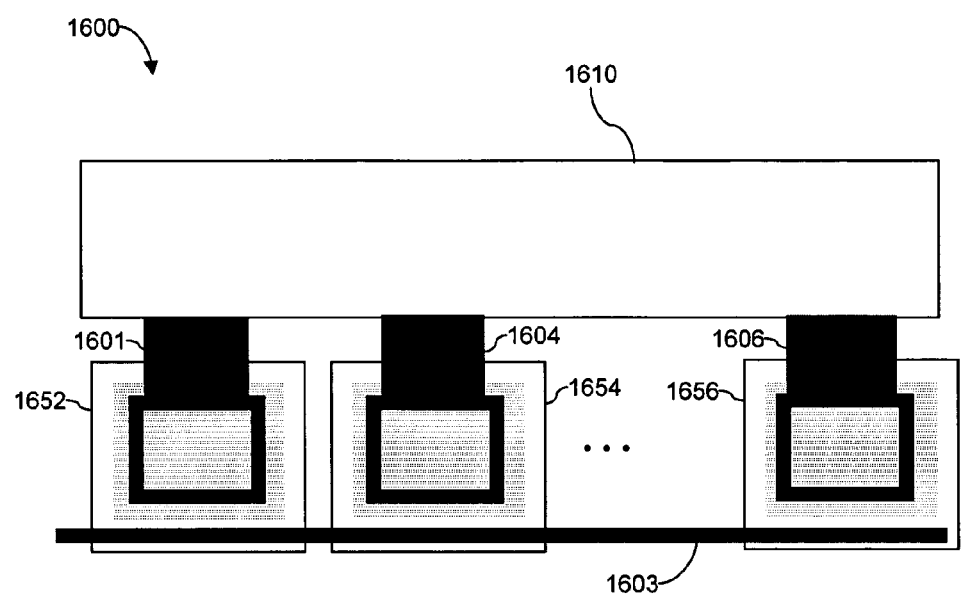
FIG. 16 is a top view schematic of an array of light emitting devices monolithically integrated with silicon electronics, in accordance with one embodiment.

FIG. 16 illustrates a top view of an array of light emitting devices monolithically integrated with silicon electronics, in accordance with one embodiment. Monolithically integrated device system 1600 may include an array of light emitting devices 1652, 1654, . . . 1656. Light emitting devices 1652, 1654 . . . 1656 which may have their top contacts electrically connected to silicon electronics 1610 by interconnects 1601, 1604, . . . 1606, respectively. The bottom contacts of light emitting devices 1652, 1654, . . . 1656 may be electrically coupled to interconnect 1603, which may, in turn, be coupled to silicon electronics, to a supply voltage source, or to ground, as the techniques presented herein are not limited in this respect. Silicon electronics 1610 may be used to control the drive current supplied to light emitting devices 1652, 1654, . . . 1656, and light emitting devices 1652, 1654, . . . 1656 may emit at least some light vertically.

Such an array of light emitting devices (e.g., LEDs) may be used as a high resolution printer bar as the spacing between light emitting devices may be defined using lithography, and hence the light emitting device size and/or the spacing between the light emitting devices may be as small as the resolution limit of the lithography process utilized (e.g., less than 20 microns, less than 10 microns, less than 1 micron, less than 0.5 microns, less than 0.25 microns, less than 0.1 microns). The array of light emitting devices monolithically integrated with silicon electronics may be fabricated using a multilayer starting wafer, such as multilayer wafer 100 of FIG. 1. The light emitting devices and the silicon electronics may be integrated using the process described in association with FIGS. 9 and 10.

Figure 17:
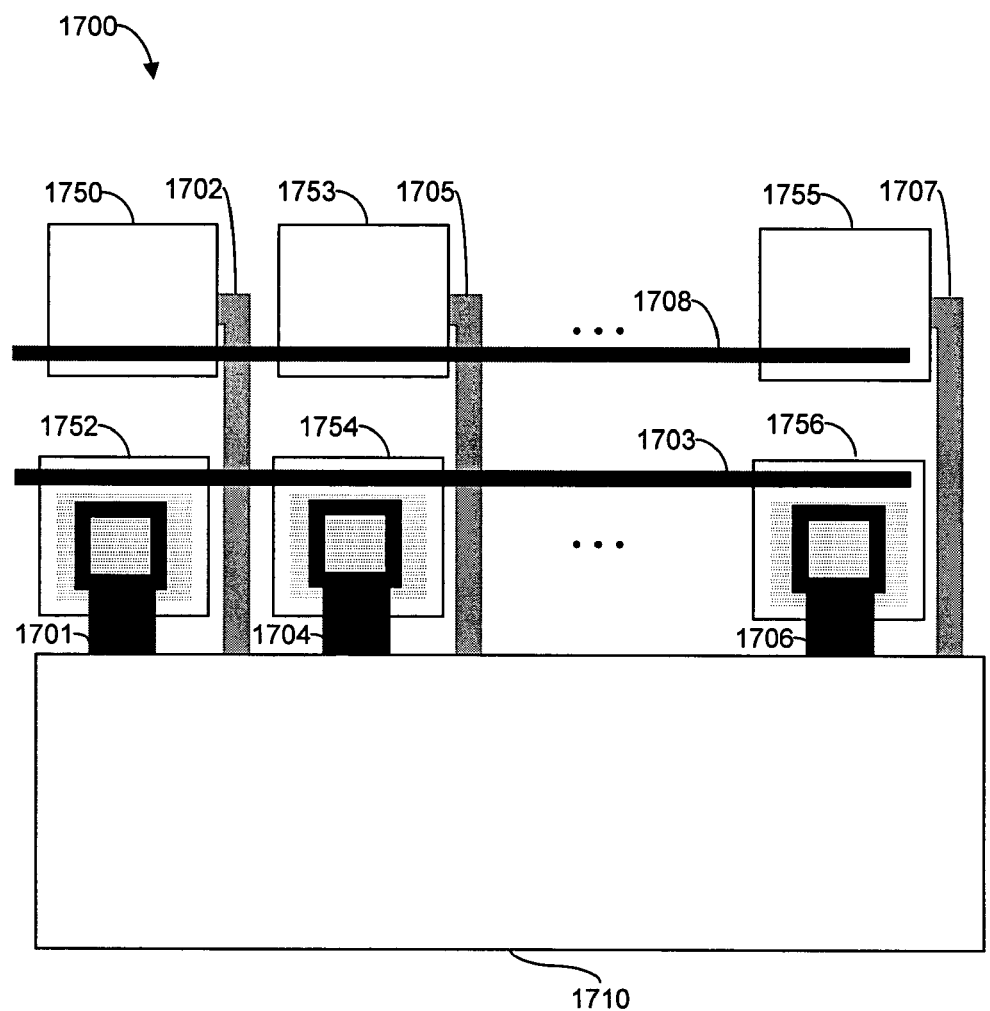
FIG. 17 is a top view schematic of an array of light emitting devices monolithically integrated with an array of photodetectors and silicon electronics, in accordance with one embodiment.

FIG. 17 illustrates a top view of monolithically integrated system 1700 comprising an array of light emitting devices, an array of photodetectors, and silicon electronics, in accordance with one embodiment. Integrated system 1700 may be fabricated using a starting wafer, such as multilayer wafer 100, and may be similar in structure to the embodiment illustrated in FIG. 14 wherein a light emitting device is integrated with a silicon photodetector and silicon electronics. Monolithically integrated system 1700 may comprise light emitting devices 1752, 1754, . . . 1756. The top contacts of the light emitting devices may be electrically contacted to silicon electronic 1710 via interconnects 1701, 1704 . . . 1706. The bottom contacts of the light emitting devices may be electrically coupled to interconnect 1703, which may in turn be electrically connected to a supply voltage source or ground, or alternatively may be coupled to silicon electronics 1710. Monolithically integrated system 1700 may include silicon photodetectors 1750, 1753, . . . 1755. The silicon photodetectors may have one terminal electrically coupled to silicon electronics 1710 by interconnects 1702, 1705, . . . 1707. Another terminal of the silicon photodetectors may be electrically connected to interconnect 1708, which may be electrically coupled to a supply voltage source, ground, or silicon electronics 1710.

Monolithically integrated system 1700 may serve as an image scanner, wherein light emitting device array 1752 may emit light via the control of drive power supplied by silicon electronics 1710 via interconnects 1701, 1704, . . . 1706. Light emitted by the array of light emitting devices may impinge on an image being scanned and/or imaged, and reflected light may be detected by the array of photodetector 1750, 1753, . . . 1755. The photodetectors may emit an electrical signal as a result of the detected light, which may be transmitted via interconnects 1702, 1705, . . . 1707 to silicon electronic 1710, which may process the electrical signal and perform image scanning operations, as in known by those of skill in the art. The monolithically integrated light emitting devices in the light emitting device array can therefore be used as local light sources for illuminating a region from which light reflection may be detected by the array of silicon photodetectors (and/or III-V photodetectors). By moving the integrated array, a surface may be scanned (e.g., imaged) using only one monolithically integrated component.

Monolithically integrated system 700 can also serve as a printer bar (e.g., a printing engine) which may include photodetector feedback control. The printer bar may use light emission from the light emitting devices to discharge charge placed on paper thus allowing toner to be selectively placed in certain areas of the paper. The printer bar can operate in a manner similar to system 1600 of FIG. 16, except that photodetector 1750, 1753, . . . 1755 can detect at least a portion of the light emitted by light emitting device 1752, 1754, . . . 1756, respectfully. The photodetectors can provide electrical signals in response to the detected light which can be transmitted to silicon electronics 1710, which can in turn modify drive power provided to one or more of the light emitting devices in response to the detected light. Such a feedback control system can ensure that the light emitting devices are functioning properly and emitting the desired amount of light, and, if not, silicon electronics 1710 may modify the drive power to the light emitting devices and/or activate and control redundant backup light emitting devices to replace the malfunctioning light emitting devices. Silicon photodetectors (and/or III-V photodetectors) monolithically integrated with light emitting devices can therefore allow for the control of light output from each light emitting device in a printer engine. This may be advantageous since light flux may be hard to control in a non-monolithic design, and each printed dot may in turn have a different darkness level. Using monolithically integrated silicon CMOS control circuitry and photodetectors, each light emitting device can be precisely controlled so as to emit the desired flux of light photons.

Although the illustration of FIG. 17 shows one illustrative arrangement of light emitting devices and photodetectors, other configurations are possible. Also, if multiple metallization interconnect layers are used, as is possible for CMOS processes, the metal interconnect layers 1702, 1705, . . . 1707 may be disposed over the light emitting devices 1752, 1754, . . . 1756, respectively. Such a configuration may allow for the packing density and hence the resolution of the light emitting device array and/or photodetector array to be increased.

It should be appreciated that the embodiments having one-dimensional arrays of light emitting devices may be modified so as to include an area of light emitting devices (e.g., a two-dimensional array) and/or an array of photodetectors (e.g., a two-dimensional array of photodetectors). Such systems could serve as printer areas and/or scanner areas, as the techniques presented herein are not limited in this respect.

Figure 18:
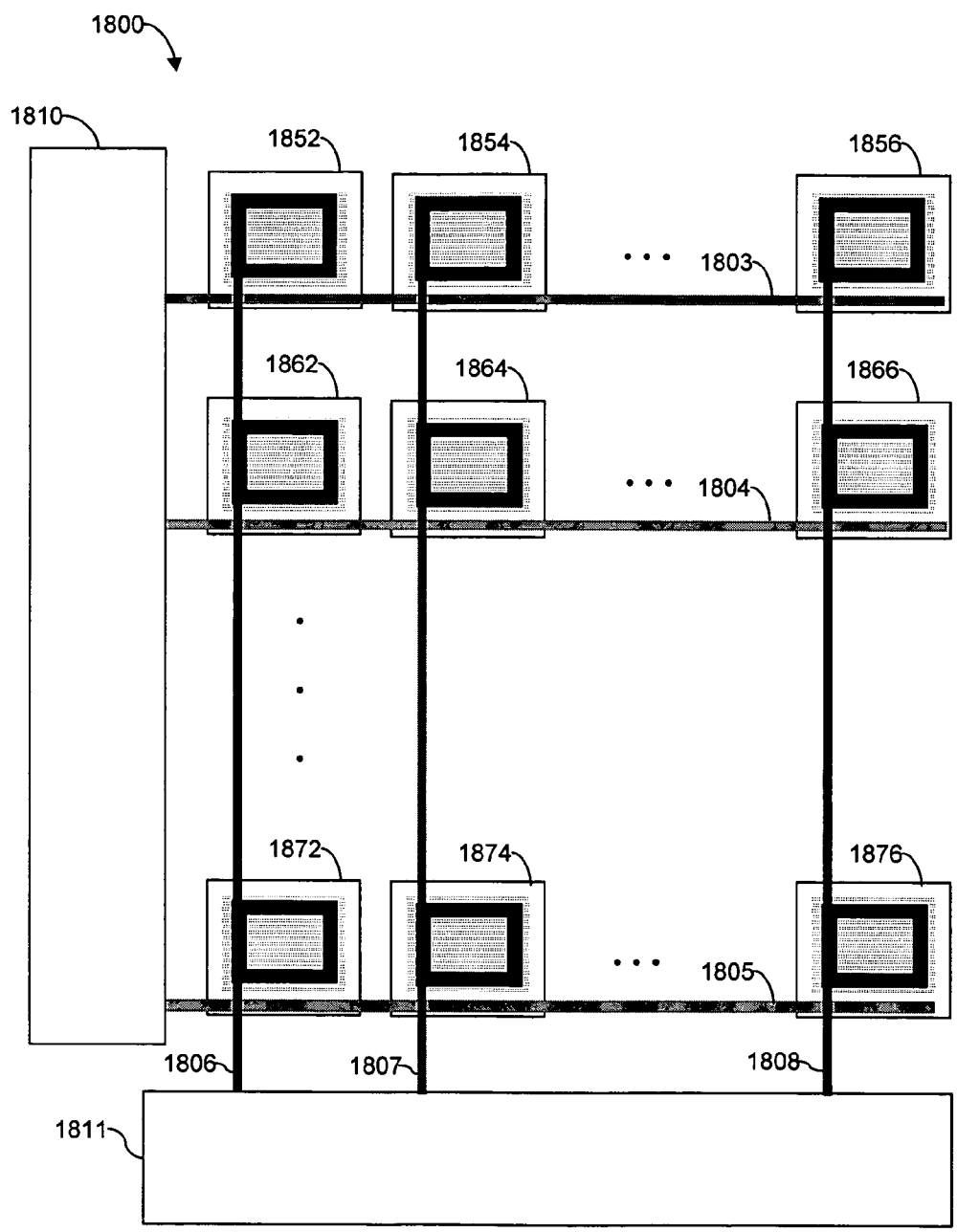
FIG. 18 is a top view schematic of a two-dimensional array of light emitting devices monolithically integrated with silicon electronics, in accordance with one embodiment.

FIG. 18 illustrates a top view of monolithically integrated system 1800 comprising a two-dimensional array of light emitting devices monolithically integrated with silicon electronics, in accordance with one embodiment. Monolithic integrated system 1800 may be fabricated using a starting multilayer wafer, such as multilayer wafer 100, and the light emitting device semiconductor structures may be epitaxially grown on the monocrystalline semiconductor layer 120 of multilayer wafer 100. Monolithically integrated system 1800 may include rows of multiple light emitting devices, each row comprising a plurality of light emitting devices. In the embodiment illustrated in FIG. 18, a first row comprises light emitting devices 1852, 1854, . . . 1856. A second row comprises light emitting devices 1862, 1864, . . . 1866. Additional rows of light emitting devices may be arranged consecutively, wherein a last row of light emitting devices comprises light emitting device 1872, 1874, . . . and 1876.

Monolithically integrated system 1800 may include silicon electronics 1810 and/or 1811 which may be electrically coupled to the array of light emitting devices. Silicon electronics 1810 and/or 1811 may serve as driver circuits and/or multiplexing addressing circuits for the two-dimensional array of light emitting devices. In one embodiment, row interconnects 1803, 1804, . . . 1805 may serve as row interconnects to electrically couple to bottom contacts of the light emitting devices. Interconnects 1806, 1807, . . . and 1808 may serve as column interconnects electrically coupled to top contacts of the light emitting devices. It should be appreciated that row and column interconnects may be separated by an insulating layer so as to ensure that the row and column interconnects are not in contact. Such an interconnect structure may provide for row and column addressing of the light emitting devices in the two-dimensional array.

The two-dimensional array of light emitting devices monolithically integrated with silicon control and/or multiplexing circuitry (e.g., silicon electronics 1810 and/or 1811) may serve as a printer area and/or as a microdisplay. Each light emitting device of the two-dimensional array of light emitting devices may serve as a pixel in a microdisplay and/or printer area. Alternatively, multiple light emitting devices may be associated with one pixel. In some embodiments, the multiple light emitting devices associated with one pixel may emit different wavelengths of light (e.g., red, green, and blue). Optics may be associated with a microdisplay and disposed over the light emitting devices so as to magnify the size of the microdisplay making it viewable to the human eye. Ultra-low cost displays can be fabricated in this manner, as very small light emitting devices can be fabricated with silicon lithography processes. Small size may be related to cost, so shrinking a display may reduces cost drastically since processes and materials cost may be relatively fixed per unit area. For extreme high brightness applications, like projection displays, the light emitting devices may include surface-emitting lasers (e.g., vertical cavity surface emitting lasers).

In further embodiments, photodetector arrays covering an area (e.g., forming a two-dimensional array) could be inter-dispersed with light emitting devices covering an area (e.g., forming a two-dimensional array). Thus, using such a monolithically integrated system, area printing and scanning can be performed. Entire areas can be scanned with no moving parts, and printing exposure can be done to an entire area or page (e.g., if the light emitting device array can be built large enough or magnified using optics).

In other embodiments, a monolithically integrated system comprising a light emitting device array of high resolution can be used as an exposure source for a programmable lithography system. In such a system, a wafer being processed may be coated with photoresist and may be exposed using the monolithically integrated system comprising the high resolution light emitting device array. The light emitting devices may be driven by integrated silicon electronics that may activate light emitting devices based at least partially on programmable commands. The programmable commands may be obtained based on mask files which define areas which should be exposed, thereby defining light emitting devices which should be activated. Such a monolithic system may therefore serve as a programmable "lithography" system for large-feature size electronics, limited only by the pitch of the light emitting device array (e.g., a two-dimensional array). For example, a light emitting device array formed of 0.25 micron light emitting devices may be used to perform the photolithography exposure of silicon circuits having gate lengths greater than or equal to about 0.5 microns.

In other embodiments, the ability to monolithically integrate silicon electronics with a two-dimensional array of light emitting devices allows for the fabrication of a silicon microprocessor monolithically integrated with a microdisplay including a plurality of light emitting devices. The microdisplay may have a high resolution, since each light emitting device may have a size limited essentially by the minimum feature size of the lithography process utilized. Such a system may serve as a computer-on-chip having an integrated microdisplay.

Figure 19:
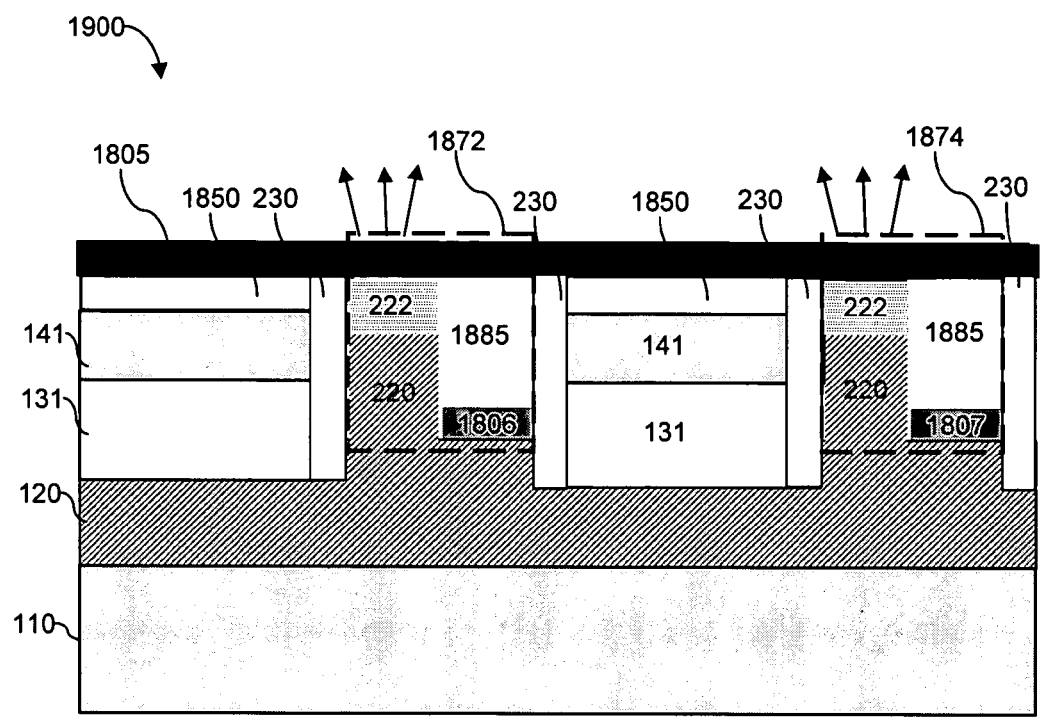
FIG. 19 is a cross-section schematic of the integrated device system of FIG. 18, in accordance with one embodiment.

FIG. 19 illustrates a cross-section of the monolithically integrated system 1800. Cross-section 1900 illustrates a cross-section of two light emitting devices 1872 and 1874 of the monolithically integrated system 1800. Arrows denote the emission of light from the light emitting devices. The cross-section further illustrates the electrical separation of row interconnect 1805 and column interconnects (1806 and 1807) by insulating layer 1885. The insulating layer 1885 may comprise any suitable insulating material, including but not limited to silicon oxide, silicon nitride, and/or silicon oxi-nitride. The cross-section further illustrate an insulating layer 1850 disposed between the metal layer 1805 and silicon layer 141. As in other embodiments presented herein, interconnects may comprise one or more metal layers, as the techniques presented herein are not limited in this respect.

Figure 20:
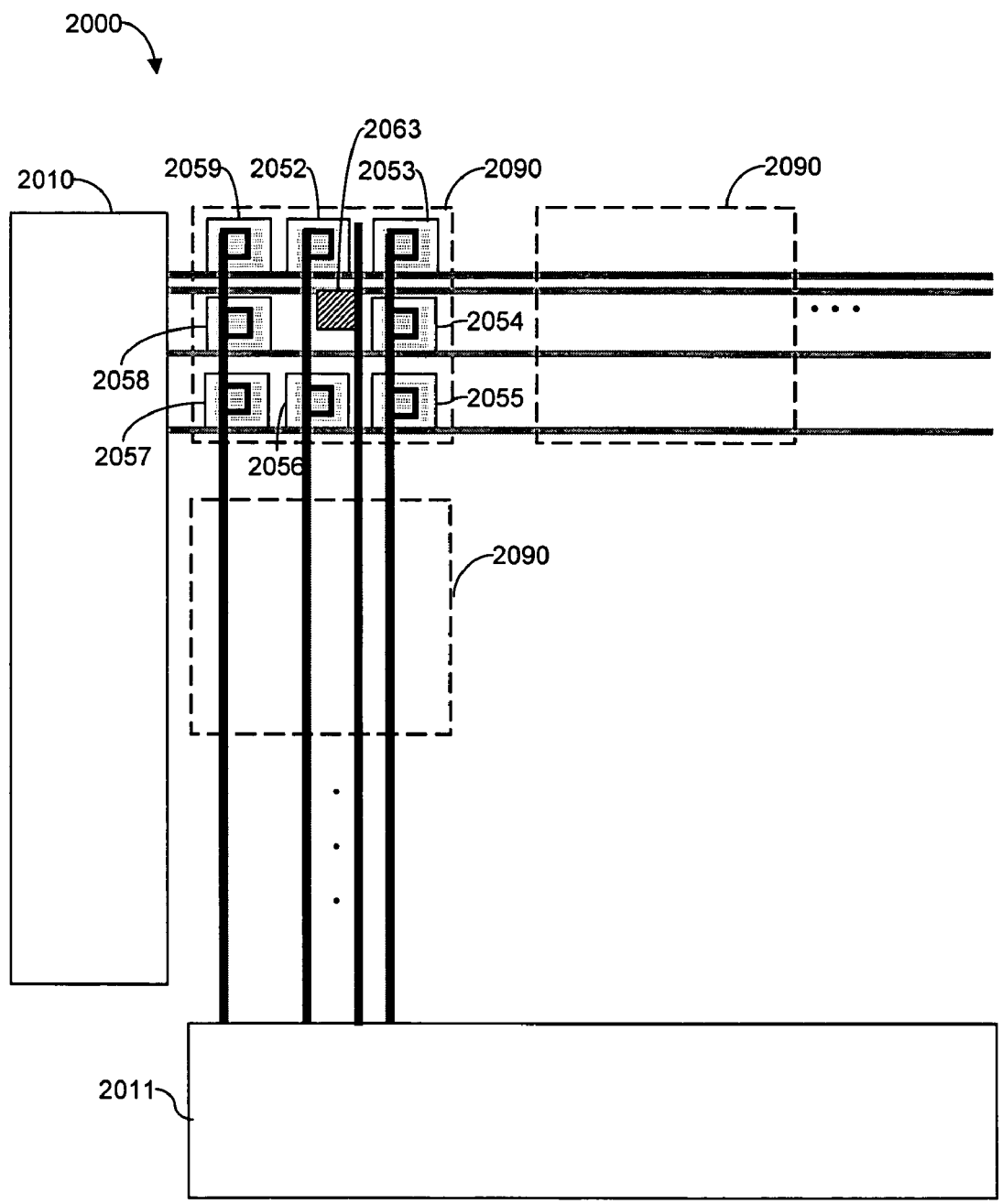
FIG. 20 is a top view schematic of a two-dimensional array of light emitting devices and photodetectors monolithically integrated with silicon electronics, in accordance with one embodiment.

FIG. 20 illustrates a top view of a monolithically integrated system 2000 comprising an array of light emitting devices, an array of photodetectors, and silicon electronics, in accordance with one embodiment. Monolithically integrated system 2000 may be fabricated using a multilayer starting wafer, such as multilayer wafer 100, and the silicon electronics and photodetectors may be fabricated on monocrystalline silicon layer 140 of multilayer wafer 100. The array of light emitting devices may be fabricated via the growth of epitaxial heterostructure layers on monocrystalline semiconductor layer 120, as previously described Monolithically integrated system 2000 may include an array of pixels (e.g., a two-dimensional array), wherein each pixel may comprise one or more light emitting devices and one or more photodetectors. For clarity, only the light emitting devices and interconnects for one pixel are shown in FIG. 20, although it should be understood that any number of pixels may be arranged to form the array of pixel. In the illustrative embodiment of FIG. 20, pixels 2090 may comprise light emitting devices 2052-9, although it should be appreciated that any number of light emitting devices may be included in a pixel. In some embodiments, each pixel may comprise light emitting devices having different emission wavelengths, such as red, green and blue emission wavelengths. Pixel 2090 may also include one or more photodetectors, such as photodetector 2063. Row and column addressing interconnects for the light emitting devices and row and column addressing interconnects for the photodetector may be provided thereby allowing for selectable electrical coupling of any one of the light emitting devices and/or any one of the photodetectors to silicon electronics 2010 and/or 2011.

During operation of system 2000, photodetectors within each pixel may detect at least a portion of the light emitted by one or more surrounding light emitting devices which are activated within that pixel. The photodetector may provide an output signal which may be received via silicon electronics 2010 and/or 2011 by a row and column addressing scheme. The photodetector signal can be used by silicon electronics 2010 and/or 2011 to determine whether the light emitting devices are functioning properly and/or to adjust the drive power supplied to one or more light emitting devices or activate redundant backup light emitting devices within each pixel. Thus, if a light emitting device within a pixel malfunctions, a redundant light emitting device within that pixel may be activated so as to replace the malfunctioning light emitting device. Such a system may provide for redundancy and thus extended lifetime of the monolithically integrated system 2000. As previously described, such an integrated system may be used as a printer array and/or a microdisplay. The microdisplay may be monolithically integrated with silicon microprocessor electronics, thereby enabling a computer on a chip.

Figure 21:
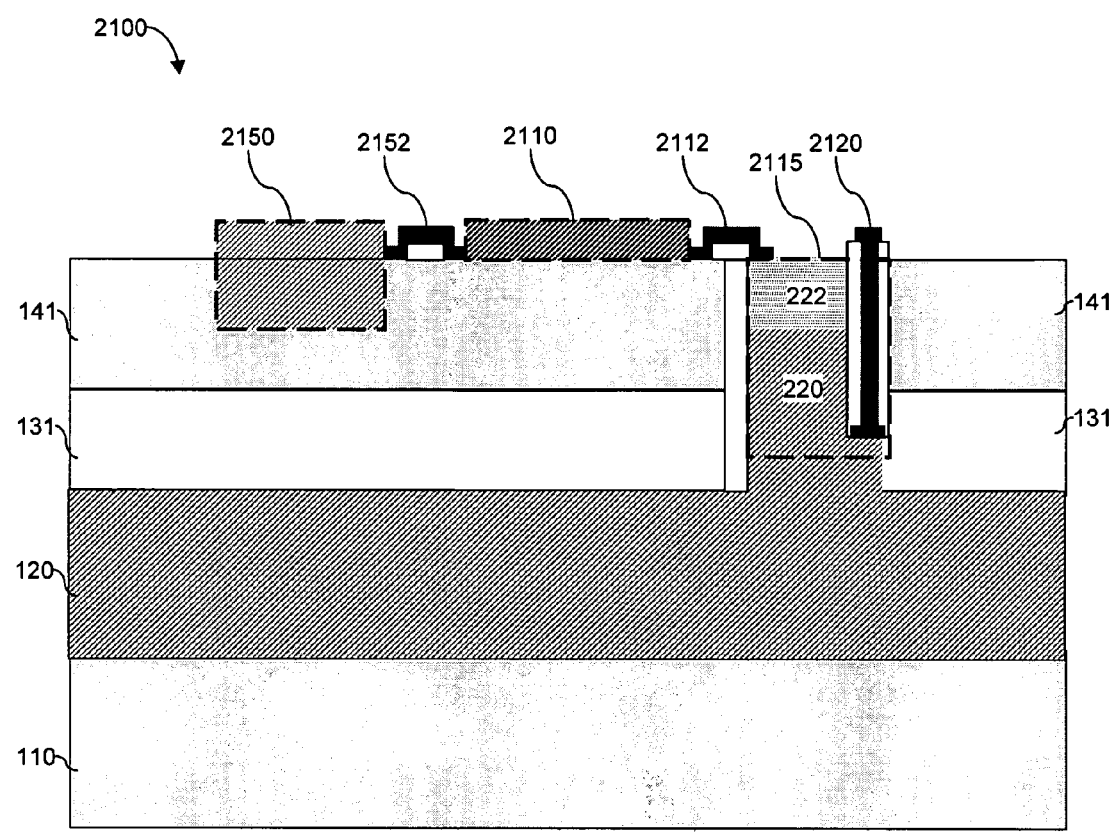
FIG. 21 is a cross-section of a monolithically integrated system including at least one silicon photodetector and at least one non-silicon photodetector, in accordance with one embodiment.

FIG. 21 illustrates a cross-section of monolithically integrated system 2100 including at least one silicon photodetector and at least one non-silicon photodetector, in accordance with one embodiment. Monolithically integrated system 2100 may be fabricated using a starting multilayer wafer, such as multilayer wafer 100. At least one silicon photodetector 2150 may be formed on monocrystalline silicon layer 141 such that the silicon-based photodetector 2150 includes an active region formed in the monocrystalline silicon layer 141.

Monolithic integrated system 2100 may include at least one non-silicon photodetector comprising an active region including at least a portion of monocrystalline semiconductor layer 222. Photodetector 2115 may be formed by epitaxially growing III-V, germanium, and/or silicon-germanium layers, or combinations thereof, on monocrystalline semiconductor layer 120 having a lattice constant different than that of relaxed silicon. In some embodiments, the non-silicon photodetector 2115 comprises an active region including a III-V material layer. In one embodiment, a non-silicon photodetector comprises an active region including a germanium layer and/or a silicon-germanium layer. The non-silicon photodetector may include appropriate dopant, such as a p-n vertical dopant profile or a p-i-n vertical dopant profile, which may be formed via in situ doping during epitaxial growth of layers 220 and 222. In one embodiment, the non-silicon photodetector is a lateral photodetector formed via the implantation of p dopants and/or n dopants having laterally-defined regions in layer 202. In embodiments including a vertical non-silicon photodetector, a metal filled via 2120 may provide for contact with a bottom region of the semiconductor structure which forms photodetector 2115. Alternatively, if the non-silicon photodetector is a lateral photodetector, surface contacts may be used to contact both the n-side and p-side regions of the photodetector.

Monolithically integrated system 2100 may further include silicon electronics 2110 which may receive output signals from silicon photodetector 2150 via interconnect 2152 and/or from non-silicon photodetector 2115 via interconnect 2112. Silicon electronics 2110 may process the received signals and output the signals as desired by the intended application. As previously described, silicon electronic may include electronics (e.g., CMOS, bipolars) which may be used to address and/or digitally process the signals received from the silicon and/or non-silicon photodetectors.

In some embodiments, arrays of silicon and non-silicon photodetectors may be monolithically integrated on a multilayer wafer, such as multilayer wafer 100. Such arrays of silicon and non-silicon photodetectors may provide for detection of light in different wavelength regions of the electromagnetic spectrum. In one embodiment, the silicon photodetectors may have a bandgap different from that of the material(s) in the active region of the non-silicon photodetector, and therefore the silicon and non-silicon photodetectors will be sensitive to different wavelength regions. In some embodiments, such monolithically integrated systems fabricated on a multilayer wafer may be used for imaging applications (e.g., a camera chip) providing for imaging in multiple wavelength regimes using a monolithically integrated chip.

Figure 22:
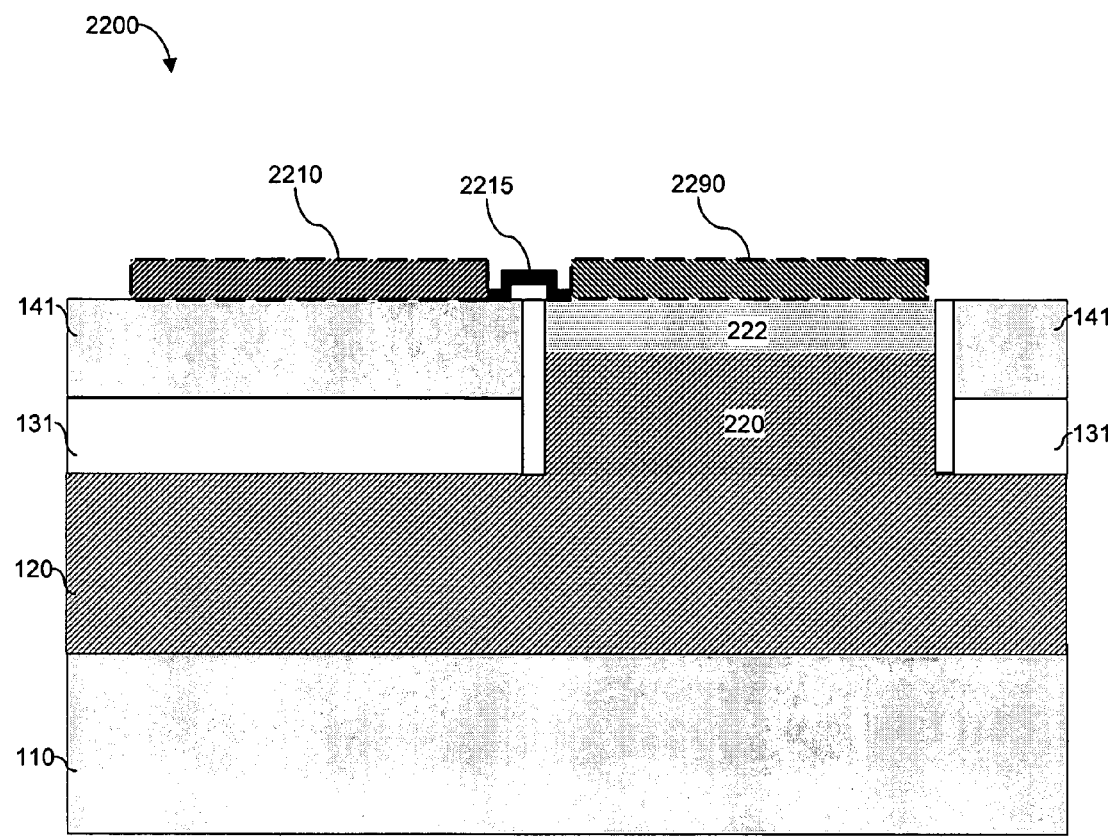
FIG. 22 is a cross-section of a monolithically integrated system comprising silicon electronics and non-silicon electronics, in accordance with one embodiment.

FIG. 22 illustrates a cross-section of a monolithically integrated system 2200 comprising silicon electronics and non-silicon electronics, in accordance with one embodiment. Monolithically integrated system 2200 may be fabricated using a multilayer starting wafer, such as multilayer wafer 100. Silicon electronics 2210 may be fabricated on monocrystalline silicon layer 141. Non-silicon electronics 2290 may be fabricated on monocrystalline semiconductor layer 222. Silicon electronics 2210 may include silicon MOSFETs such as NMOS, PMOS, and combinations thereof, such as silicon CMOS. Silicon electronics 2110 may include silicon bipolars, silicon diodes, resistors, capacitors, and/or inductors.

Non-silicon electronics 2290 may include III-V HBTs, HEMTs and/or MESFETs. Non-silicon electronics 2290 may include germanium and/or silicon-germanium based electronic devices, such as germanium and/or silicon-germanium FETs. Alternatively or additionally, non-silicon electronics may include silicon-germanium HBTs. Silicon electronics 2210 and non-silicon electronics 2290 may be interconnected via interconnect 2215. In some embodiments interconnect 2215 may be a metal interconnect used for contacting silicon. Such an interconnect may be compatible with both the silicon electronics and the non-silicon electronics region. In some embodiments, the monocrystalline semiconductor layer 222 may be capped with a silicon capping layer to facilitate the reintroduction of the wafer into a silicon fabrication facility and/or the contacting of the non-silicon device using silicon silicidation metals.

As previously described in the description of the process of FIG. 9, the non-silicon electronics material 222 (and 220) may be epitaxially grown after silicon front-end processing of silicon electronics 2210 has been performed. Via the growth of a silicon capping layer at the surface of layer 222, the wafer may be reintroduced into a silicon fabrication facility after epitaxial growth of layers 222 (and 220) to facilitate silicon device and/or non-silicon device back-end processing. During such back-end processing, interconnection 2215 between silicon and non-silicon electronics may be formed.

Monolithically integrated device system 2200 may be used to enable the fabrication of monolithically integrated III-V analog devices with silicon analog and/or silicon digital circuits. Such device integration may allow for the fabrication of a monolithically integrated communication circuit, wherein a III-V (e.g., GaAs, GaN) power amplifier and/or III-V analog circuits may be monolithically integrated with silicon circuits that can provide for digital processing capabilities and can be used to improve the performance of the III-V devices. In some embodiments, the monolithically integrated silicon circuits may improve the performance of III-V devices by compensating for performance variations between III-V devices. Silicon compensation of III-V devices may involve using silicon logic circuitry to compensate for variations in the electrical behavior of III-V devices (e.g., which may be due to process variations between devices).

Thus, monolithically integrated communication chips can be fabricated using the techniques presented herein. In typical RF (or optical systems), III-V devices may serve as the front-end of the communication system, interacting with electromagnetic waves and translating analog signals into digital signals. When III-V circuits and devices are used, separate chips are typically incorporated into a chipset including a III-V chip and a silicon chip. Presently, III-V chips are typically fabricated using separate manufacturing infrastructures. Using the techniques described herein, III-V HEMTs, HBTs, bipolars, and/or MESFETs can be monolithically integrated with silicon CMOS technology, thereby enabling a single-chip communication solution. By creating a single-chip solution, power use can be decreased, and bandwidth can be increased, thus increasing performance, while at the same time decreasing cost. In some embodiments, III-V devices can be manufactured in same way they are currently fabricated in III-V fabrication facilities. In other embodiments, once incorporated into a silicon fabrication facility, silicon processes can be used to replace specialized III-V processing.

Single-chip solutions can enable a cell-phone-on-a-chip and/or a computer-on-a-chip. Since the techniques presented herein enable power amps, III-V transceiver circuits, microdisplays, and/or silicon logic to be monolithically integrated on a single chip, a fully integrated cell-phone-on-chip and/or computer-on-chip may be fabricated. For some embodiments, it is anticipated that a cell-phone-on-a-chip and/or a computer-on-a-chip fabricated using the techniques presented herein may entail fabrication costs of about $1-$10 for low-end applications.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. The use of "disposing" as used herein is meant to include any method of creating a layer, structure, or device. Such methods can include, but are not limited to, deposition (e.g., epitaxial growth, chemical vapor deposition, physical deposition) and wafer bonding.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A monolithically integrated semiconductor device structure comprising:
   a silicon substrate;
   a first monocrystalline semiconductor layer disposed over the silicon substrate, wherein the first monocrystalline semiconductor layer has a lattice constant different from a lattice constant of relaxed silicon;
   an insulating layer disposed over the first monocrystalline semiconductor layer in a first region;
   a monocrystalline silicon layer disposed over the insulating layer in the first region;
   at least one silicon-based electronic device comprising an element including at least a portion of the monocrystalline silicon layer;
   a second monocrystalline semiconductor layer disposed over at least a portion of the first monocrystalline semiconductor layer in a second region and absent from the first region, wherein the second monocrystalline semiconductor layer has a lattice constant different from the lattice constant of relaxed silicon; and
   at least one III-V light-emitting device comprising an active region including at least a portion of the second monocrystalline semiconductor layer.

2. The structure of claim 1, wherein the second monocrystalline semiconductor layer has a composition different than that of the first monocrystalline layer.

3. The structure of claim 1, wherein the at least one silicon-based electronic device comprises a metal oxide semiconductor field-effect transistor.

4. The structure of claim 1, wherein the at least one III-V light-emitting device comprises a light emitting diode.

5. The structure of claim 1, wherein the at least one III-V light-emitting device comprises a plurality of light emitting diodes.

6. The structure of claim 5, wherein the plurality of light emitting diodes are arranged in a one-dimensional array.

7. The structure of claim 5, wherein the plurality of light emitting diodes are arranged in a two-dimensional array.

8. The structure of claim 7, wherein the two-dimensional array covers a rectangular area.

9. The structure of claim 1, further comprising:
   an electrical interconnect coupling at least one silicon-based electronic device and the at least one III-V light-emitting device.

10. The structure of claim 9, wherein the at least one silicon-based electronic device is configured to drive the at least one III-V light-emitting device.

11. The structure of claim 1, further comprising:
    at least one silicon-based photodetector comprising an active region including at least a portion of the monocrystalline silicon layer.

12. The structure of claim 1, further comprising:
    an optical waveguide disposed between the at least one III-V light-emitting device and the at least one silicon-based photodetector, the optical waveguide configured to guide at least a portion of light emitted by the at least one III-V light-emitting device to the at least one silicon-based photodetector.

13. The structure of claim 1, wherein the second monocrystalline semiconductor layer is disposed in contact with the at least a portion of the first monocrystalline semiconductor layer.

14. The semiconductor structure of claim 1, wherein a top surface of the second monocrystalline semiconductor layer is substantially coplanar with a top surface of the monocrystalline silicon layer.

15. The semiconductor structure of claim 1, wherein the second monocrystalline semiconductor layer comprises a III-V semiconductor layer.

16. The semiconductor structure of claim 15, further comprising a silicon layer disposed over the III-V semiconductor layer, wherein the silicon layer is disposed in contact with the III-V semiconductor layer.

17. The semiconductor structure of claim 1, wherein the monocrystalline silicon layer comprises a relaxed silicon layer.

18. The semiconductor structure of claim 1, wherein the monocrystalline silicon layer comprises a strained silicon layer.

19. The semiconductor structure of claim 1, further comprising a second insulating layer disposed over the silicon substrate and under the first monocrystalline semiconductor layer.

20. The semiconductor structure of claim 1, wherein the first monocrystalline semiconductor layer comprises at least two monocrystalline semiconductor layers disposed over each other and having lattice constants different from each other and different from the lattice constant of relaxed silicon.

21. The semiconductor structure of claim 20, wherein the at least two monocrystalline semiconductor layers comprise a germanium layer and an InP layer.

22. The semiconductor structure of claim 20, wherein the at least two monocrystalline semiconductor layers comprise a germanium layer and a GaN layer.

23. The semiconductor structure of claim 20, wherein the at least two monocrystalline semiconductor layers comprise a GaAs layer and an InP layer.

24. The semiconductor structure of claim 20, wherein the at least two mono-crystalline semiconductor layers comprise a GaAs layer and a GaN layer.

25. The semiconductor structure of claim 1, wherein the first monocrystalline semiconductor layer comprises a germanium layer.

26. The semiconductor structure of claim 25, wherein the first monocrystalline semiconductor layer further comprises a silicon-germanium graded layer disposed under the germanium layer.

27. The semiconductor structure of claim 25, further comprising a second insulating layer disposed over the silicon substrate and under the germanium layer.

28. The semiconductor structure of claim 27, wherein the germanium layer is disposed in contact with the second insulating layer.

29. The semiconductor structure of claim 1, wherein the first monocrystalline semiconductor layer comprises a silicon-germanium layer.

30. The semiconductor structure of claim 29, wherein the first monocrystalline semiconductor layer further comprises a silicon-germanium graded layer disposed under the silicon-germanium layer.

31. The semiconductor structure of claim 29, further comprising a second insulating layer disposed over the silicon substrate and under the silicon-germanium layer.

32. The semiconductor structure of claim 31, wherein the silicon-germanium layer is disposed in contact with the second insulating layer.

33. The semiconductor structure of claim 1, wherein the first monocrystalline semiconductor layer comprises a III-V semiconductor layer.

34. The semiconductor structure of claim 33, wherein the III-V semiconductor layer comprises a GaN layer.

35. The semiconductor structure of claim 33, wherein the III-V semiconductor layer comprises a GaAs layer.

36. The semiconductor structure of claim 33, wherein the first monocrystalline semiconductor layer further comprises a germanium layer disposed under the III-V semiconductor layer.

37. The semiconductor structure of claim 33, wherein the first monocrystalline semiconductor layer further comprises a silicon-germanium layer disposed under the III-V semiconductor layer.

38. The semiconductor structure of claim 33, wherein the first monocrystalline semiconductor layer further comprises a silicon-germanium graded layer disposed under the III-V semiconductor layer.

39. The semiconductor structure of claim 1, wherein the silicon substrate has a diameter of at least 150 millimeters.

40. The semiconductor structure of claim 1, wherein the silicon substrate has a diameter of at least 200 millimeters.

41. A monolithically integrated semiconductor device structure comprising:
    a silicon substrate;
    a first monocrystalline semiconductor layer disposed over the silicon substrate, wherein the first monocrystalline semiconductor layer has a lattice constant different from a lattice constant of relaxed silicon;
    a monocrystalline silicon layer disposed over the first monocrystalline semiconductor layer in the first region;
    at least one silicon-based electronic device comprising an element including at least a portion of the monocrystalline silicon layer;
    a second monocrystalline semiconductor layer disposed on at least a portion of the first monocrystalline semiconductor layer in a second region and absent from the first region, wherein the second monocrystalline semiconductor layer has a lattice constant different from the lattice constant of relaxed silicon; and
    at least one III-V light-emitting device comprising an active region including at least a portion of the second monocrystalline semiconductor layer.

42. The semiconductor structure of claim 41, further comprising a layer in the first region disposed between the monocrystalline silicon layer and the first monocrystalline semiconductor layer.

43. The semiconductor structure of claim 42, wherein the layer in the first region disposed between the monocrystalline silicon layer and the first monocrystalline semiconductor layer is a non-insulating layer.

44. The semiconductor structure of claim 42, wherein the layer in the first region disposed between the monocrystalline silicon layer and the first monocrystalline semiconductor layer is an insulating layer.

45. The semiconductor structure of claim 41, wherein at least a portion of the second monocrystalline semiconductor layer has a composition different than a composition of the first monocrystalline layer.

* * * * *